(12) United States Patent
Lubomirsky et al.

(10) Patent No.: US 7,651,934 B2
(45) Date of Patent: Jan. 26, 2010

(54) PROCESS FOR ELECTROLESS COPPER DEPOSITION

(75) Inventors: Dmitry Lubomirsky, Cupertino, CA (US); Timothy W. Weidman, Sunnyvale, CA (US); Arulkumar Shanmugasundram, Sunnyvale, CA (US); Nicolay Y. Kovarsky, Sunnyvale, CA (US); Kapila Wijekoon, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 766 days.

(21) Appl. No.: 11/385,037

(22) Filed: Mar. 20, 2006

(65) Prior Publication Data

US 2007/0004201 A1   Jan. 4, 2007

Related U.S. Application Data

(60) Provisional application No. 60/663,492, filed on Mar. 18, 2005.

(51) Int. Cl.
*H01L 21/20* (2006.01)
*H01L 21/3205* (2006.01)
*H01L 21/4763* (2006.01)

(52) U.S. Cl. .............. 438/584; 438/585; 257/E21.171; 257/E21.576

(58) Field of Classification Search ............... 438/584, 438/585, 650, 686; 257/E21.577, E21.171, 257/E21.241, E21.576, E21.582, E21.591
See application file for complete search history.

(56) References Cited

U.S. PATENT DOCUMENTS 2,369,620 A   2/1945 Sullivan et al.
3,403,035 A   9/1968 Schneble et al.
3,745,039 A   7/1973 Feldstein et al.
3,937,857 A   2/1976 Brummett et al.

(Continued)

FOREIGN PATENT DOCUMENTS

EP   0 329 406   8/1989

(Continued)

OTHER PUBLICATIONS

Dubin, et al. "Selective and Blanket Electroless Copper Deposition for Ultralarge Scale Integration," J. Electrochem. Soc., vol. 144, No. 3, Mar. 1997, pp. 898-908.

(Continued)

*Primary Examiner*—Walter L Lindsay, Jr.
(74) *Attorney, Agent, or Firm*—Patterson & Sheridan

(57) ABSTRACT

Embodiments of the invention provide methods for forming conductive materials within contact features on a substrate by depositing a seed layer within a feature and subsequently filling the feature with a copper-containing material during an electroless deposition process. In one example, a copper electroless deposition solution contains levelers to form convexed or concaved copper surfaces. In another example, a seed layer is selectively deposited on the bottom surface of the aperture while leaving the sidewalls substantially free of the seed material during a collimated PVD process. In another example, the seed layer is conformably deposited by a PVD process and subsequently, a portion of the seed layer and the underlayer are plasma etched to expose an underlying contact surface. In another example, a ruthenium seed layer is formed on an exposed contact surface by an ALD process utilizing the chemical precursor ruthenium tetroxide.

41 Claims, 8 Drawing Sheets

U.S. PATENT DOCUMENTS

| | | | |
|---|---|---|---|
| 4,006,047 A | 2/1977 | Brummett et al. | |
| 4,150,177 A | 4/1979 | Guditz et al. | |
| 4,232,060 A | 11/1980 | Mallory et al. | |
| 4,234,628 A | 11/1980 | DuRose | |
| 4,265,943 A | 5/1981 | Goldstein et al. | |
| 4,364,803 A | 12/1982 | Nidola et al. | |
| 4,366,035 A | 12/1982 | Wilkinson | |
| 4,368,223 A | 1/1983 | Kobayashi et al. | |
| 4,397,812 A | 8/1983 | Mallory, Jr. | |
| 4,424,241 A | 1/1984 | Abys | |
| 4,632,857 A | 12/1986 | Mallory, Jr. | |
| 4,795,660 A | 1/1989 | Cooray et al. | |
| 4,810,520 A | 3/1989 | Wu | |
| 4,867,882 A | 9/1989 | O'Neill et al. | |
| 5,055,199 A | 10/1991 | O'Neill et al. | |
| 5,102,456 A | 4/1992 | Jagannathan et al. | |
| 5,141,626 A | 8/1992 | Tanaka et al. | |
| 5,147,692 A | 9/1992 | Bengston | |
| 5,169,680 A | 12/1992 | Ting et al. | |
| 5,200,048 A | 4/1993 | Tanaka et al. | |
| 5,203,911 A | 4/1993 | Sricharoenchaikit et al. | |
| 5,212,138 A | 5/1993 | Krulik et al. | |
| 5,234,628 A | 8/1993 | Trabitzsch et al. | |
| 5,235,139 A | 8/1993 | Bengston et al. | |
| 5,240,497 A | 8/1993 | Shacham et al. | |
| 5,248,527 A | 9/1993 | Uchida et al. | |
| 5,380,560 A | 1/1995 | Kaja et al. | |
| 5,384,284 A | 1/1995 | Doan et al. | |
| 5,415,890 A | 5/1995 | Kloiber et al. | |
| 5,478,462 A | 12/1995 | Walsh | |
| 5,510,216 A | 4/1996 | Calabrese et al. | |
| 5,614,003 A | 3/1997 | Mallory et al. | |
| 5,648,125 A | 7/1997 | Cane | |
| 5,654,245 A | 8/1997 | Allen | |
| 5,674,787 A | 10/1997 | Zhao et al. | |
| 5,695,810 A | 12/1997 | Dubin et al. | |
| 5,702,573 A | 12/1997 | Biberger et al. | |
| 5,733,816 A | 3/1998 | Iyer et al. | |
| 5,755,859 A | 5/1998 | Brusic et al. | |
| 5,824,599 A | 10/1998 | Shacham-Diamand et al. | |
| 5,830,805 A | 11/1998 | Shacham-Diamand et al. | |
| 5,843,538 A | 12/1998 | Ehrsam et al. | |
| 5,846,598 A | 12/1998 | Semkow et al. | |
| 5,882,433 A | 3/1999 | Ueno | |
| 5,885,749 A | 3/1999 | Huggins et al. | |
| 5,891,513 A | 4/1999 | Dubin et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,932,077 A | 8/1999 | Reynolds | |
| 5,969,422 A | 10/1999 | Ting et al. | |
| 6,010,962 A | 1/2000 | Liu et al. | |
| 6,015,724 A | 1/2000 | Yamazaki | |
| 6,015,747 A | 1/2000 | Lopatin et al. | |
| 6,046,108 A | 4/2000 | Liu et al. | |
| 6,065,424 A | 5/2000 | Shacham-Diamand et al. | |
| 6,077,780 A | 6/2000 | Dubin | |
| 6,100,184 A | 8/2000 | Zhao et al. | |
| 6,107,199 A | 8/2000 | Allen et al. | |
| 6,110,530 A | 8/2000 | Chen et al. | |
| 6,113,771 A | 9/2000 | Landau et al. | |
| 6,136,163 A | 10/2000 | Cheung et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,153,935 A | 11/2000 | Edelstein et al. | |
| 6,165,912 A | 12/2000 | McConnell et al. | |
| 6,171,661 B1 | 1/2001 | Zheng et al. | |
| 6,174,812 B1 | 1/2001 | Hsiung et al. | |
| 6,180,523 B1 | 1/2001 | Lee et al. | |
| 6,197,181 B1 | 3/2001 | Chen | |
| 6,197,364 B1 | 3/2001 | Paunovic et al. | |
| 6,197,688 B1 | 3/2001 | Simpson | |
| 6,228,233 B1 | 5/2001 | Lakshmikanthan et al. | |
| 6,242,349 B1 | 6/2001 | Nogami et al. | |
| 6,245,655 B1 * | 6/2001 | Moslehi | 438/612 |
| 6,245,670 B1 | 6/2001 | Cheung et al. | |
| 6,251,236 B1 | 6/2001 | Stevens | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,258,707 B1 | 7/2001 | Uzoh | |
| 6,261,637 B1 | 7/2001 | Oberle | |
| 6,271,135 B1 | 8/2001 | Palmans et al. | |
| 6,277,263 B1 | 8/2001 | Chen | |
| 6,287,968 B1 | 9/2001 | Yu et al. | |
| 6,290,833 B1 | 9/2001 | Chen | |
| 6,291,082 B1 | 9/2001 | Lopatin | |
| 6,291,348 B1 | 9/2001 | Lopatin et al. | |
| 6,309,969 B1 | 10/2001 | Oskam et al. | |
| 6,319,387 B1 | 11/2001 | Krishnamoorthy et al. | |
| 6,323,128 B1 | 11/2001 | Sambucetti et al. | |
| 6,342,733 B1 | 1/2002 | Hu et al. | |
| 6,344,125 B1 | 2/2002 | Locke et al. | |
| 6,344,410 B1 | 2/2002 | Lopatin et al. | |
| 6,350,364 B1 | 2/2002 | Jang | |
| 6,391,785 B1 | 5/2002 | Satta et al. | |
| 6,416,647 B1 | 7/2002 | Dordi et al. | |
| 6,428,673 B1 | 8/2002 | Ritzdorf et al. | |
| 6,431,190 B1 | 8/2002 | Oka et al. | |
| 6,432,819 B1 | 8/2002 | Pavate et al. | |
| 6,432,821 B1 | 8/2002 | Dubin et al. | |
| 6,436,267 B1 | 8/2002 | Carl et al. | |
| 6,436,816 B1 | 8/2002 | Lee et al. | |
| 6,441,492 B1 | 8/2002 | Cunningham | |
| 6,482,740 B2 | 11/2002 | Soininen et al. | |
| 6,486,055 B1 | 11/2002 | Jung et al. | |
| 6,503,834 B1 | 1/2003 | Chen et al. | |
| 6,516,815 B1 | 2/2003 | Stevens et al. | |
| 6,517,894 B1 | 2/2003 | Hongo et al. | |
| 6,528,409 B1 | 3/2003 | Lopatin et al. | |
| 6,544,399 B1 | 4/2003 | Landau et al. | |
| 6,551,483 B1 | 4/2003 | Mayer et al. | |
| 6,565,729 B2 | 5/2003 | Chen et al. | |
| 6,573,606 B2 | 6/2003 | Sambucetti et al. | |
| 6,588,437 B1 | 7/2003 | Higashi | |
| 6,596,151 B2 | 7/2003 | Landau et al. | |
| 6,596,643 B2 | 7/2003 | Chen et al. | |
| 6,605,874 B2 | 8/2003 | Leu et al. | |
| 6,616,772 B2 | 9/2003 | de Larios et al. | |
| 6,616,967 B2 | 9/2003 | Test | |
| 6,620,719 B1 | 9/2003 | Andry et al. | |
| 6,632,345 B1 | 10/2003 | Chen | |
| 6,638,410 B2 | 10/2003 | Chen et al. | |
| 6,645,550 B1 | 11/2003 | Cheung et al. | |
| 6,645,567 B2 | 11/2003 | Chebiam et al. | |
| 6,680,540 B2 | 1/2004 | Nakano et al. | |
| 6,709,563 B2 | 3/2004 | Nagai et al. | |
| 6,717,189 B2 | 4/2004 | Inoue et al. | |
| 6,743,473 B1 | 6/2004 | Parkhe et al. | |
| 6,756,682 B2 | 6/2004 | Sinha et al. | |
| 6,784,096 B2 | 8/2004 | Chen et al. | |
| 6,787,450 B2 | 9/2004 | Sinha et al. | |
| 6,794,288 B2 | 9/2004 | Kolics et al. | |
| 6,797,312 B2 | 9/2004 | Kong et al. | |
| 6,821,909 B2 | 11/2004 | Ramanathan et al. | |
| 6,824,612 B2 | 11/2004 | Stevens et al. | |
| 6,824,666 B2 | 11/2004 | Gandikota et al. | |
| 6,852,618 B2 | 2/2005 | Chopra | |
| 6,867,136 B2 | 3/2005 | Basol et al. | |
| 7,049,226 B2 | 5/2006 | Chung et al. | |
| 7,442,267 B1 * | 10/2008 | Webb et al. | 148/518 |
| 2001/0042689 A1 | 11/2001 | Chen | |

| | | | |
|---|---|---|---|
| 2002/0004293 | A1 | 1/2002 | Soininen et al. |
| 2002/0060363 | A1 | 5/2002 | Xi et al. |
| 2002/0098681 | A1 | 7/2002 | Hu et al. |
| 2002/0098711 | A1 | 7/2002 | Klein |
| 2002/0182385 | A1 | 12/2002 | Senkevich et al. |
| 2003/0010645 | A1 | 1/2003 | Ting et al. |
| 2003/0059538 | A1 | 3/2003 | Chung et al. |
| 2003/0075808 | A1 | 4/2003 | Inoue et al. |
| 2003/0082307 | A1 | 5/2003 | Chung et al. |
| 2003/0113576 | A1 | 6/2003 | Chebiam et al. |
| 2003/0116439 | A1 | 6/2003 | Seo et al. |
| 2003/0124262 | A1 | 7/2003 | Chen et al. |
| 2003/0141018 | A1 | 7/2003 | Stevens et al. |
| 2003/0155247 | A1 | 8/2003 | Miura et al. |
| 2003/0181040 | A1 | 9/2003 | Ivanov et al. |
| 2003/0186535 | A1 | 10/2003 | Wong et al. |
| 2004/0035316 | A1 | 2/2004 | Chebiam et al. |
| 2004/0038073 | A1 | 2/2004 | Chebiam et al. |
| 2004/0048461 | A1 | 3/2004 | Chen et al. |
| 2004/0065540 | A1 | 4/2004 | Mayer et al. |
| 2004/0072419 | A1 | 4/2004 | Baskaran et al. |
| 2004/0096592 | A1 | 5/2004 | Chebiam et al. |
| 2004/0105934 | A1 | 6/2004 | Chang et al. |
| 2004/0113277 | A1 | 6/2004 | Chiras et al. |
| 2004/0175509 | A1 | 9/2004 | Kolics et al. |
| 2004/0203224 | A1 | 10/2004 | Halahan et al. |
| 2004/0241321 | A1 | 12/2004 | Ganguli et al. |
| 2004/0262772 | A1 | 12/2004 | Ramanathan et al. |
| 2004/0265501 | A1 | 12/2004 | Choi et al. |
| 2005/0006245 | A1 | 1/2005 | Sun et al. |
| 2005/0090098 | A1 | 4/2005 | Dubin et al. |
| 2005/0106865 | A1 | 5/2005 | Chung et al. |
| 2005/0118807 | A1 | 6/2005 | Kim et al. |
| 2005/0124154 | A1 | 6/2005 | Park et al. |
| 2005/0136185 | A1 | 6/2005 | Ramanathan et al. |
| 2005/0212058 | A1 | 9/2005 | Huang et al. |
| 2005/0212139 | A1 | 9/2005 | Leinikka et al. |
| 2005/0238808 | A1 | 10/2005 | Gatineau et al. |
| 2005/0258499 | A1 | 11/2005 | Huang et al. |
| 2006/0084267 | A1 | 4/2006 | Kwak et al. |

FOREIGN PATENT DOCUMENTS

| | | |
|---|---|---|
| EP | 0 475 567 | 3/1992 |
| EP | 0 913 498 | 5/1999 |
| GB | 2285174 | 6/1995 |
| JP | 59215473 A | 12/1984 |
| JP | 7-297543 | 11/1995 |
| JP | 11-124682 | 5/1999 |
| WO | WO 88/08887 | 11/1988 |

OTHER PUBLICATIONS

Eze, et al. "Chemical-bath-deposited cobalt sulphide films: preparation effects," Materials Chemistry and Physics, 47 (1997), pp. 31-36.

Eze "Electroless deposition of CoO thin films," J. Phys. D. Appl. Phys. 32 (1999), pp. 533-540.

Georgiou, et al. "Thick Selective Electroless-Plated Cobalt-Nickel Alloy Contacts to $CoSi_2$," J. Electrochem. Soc., vol. 138, No. 7, Jul. 1991, pp. 2061-2069.

Hu, et al. "Reduced electromigration of Cu wires by surface coating," Applied Physics Letters, vol. 81, No. 10, Sep. 2002, pp. 1782-1784.

Lin, et al. "Manufacturing of Cu/Electroless Nickel/Sn-Pb Flip Chip Solder Bumps," IEEE Transactions on Advanced Packaging, vol. 22, No. 4 (Nov. 1999), pp. 575-579.

Lopatin, et al. "Thin Electroless barrier for copper films," Part of the SPIE Conference of Multilevel Interconnect technology II, SPIE vol. 3508 (1998), pp. 65-77.

Partial International Search Report dated Apr. 6, 2005 regarding International Application No. PCT/US2004/034044.

Partial International Search Report dated Apr. 6, 2005 regarding International Application No. PCT/US2004/034449.

Partial International Search Report dated Jul. 8, 2005 regarding International Application No. PCT/US03/10073.

Pearlstein, et al. "Electroless Cobalt Deposition from Acid Baths," J. Electrochem. Soc.: Electrochemical Science and Technology, Aug. 1974, vol. 121, No. 8, pp. 1023-1028.

Pearlstein "Electroless Plating," J. Res. Natl. Bur. Stan., Ch. 31 (1963), pp. 710-747.

Saito, et al. "Electroless deposition of Ni-B, Co-B and Ni-Co-B alloy using dimethylaminoborane as a reducing agent," J. of Appl. Electrochemistry 28 (1998), pp. 559-563.

Shacham-Diamand, et al. "Copper electroless deposition technology for ultra-large-scale-integration (ULSI) metallization," Microelectric Engineering 33 (1997), pp. 47-58.

Shacham-Diamand, et al. "Electrochemically deposited thin film alloys for ULSI and MEMS applications," Microelectronic Engineering 50 (2000), pp. 525-531.

Shacham-Diamand, et al. "Electroless copper deposition for ULSI," Thin Solid Films 262 (1995), pp. 93-103.

Shacham-Diamand, et al. "High Aspect Ratio Quarter-Micron Electroless Copper Integrated Technology," Microelectronic Engineering 37/38 (1997), pp. 77-88.

Shacham-Diamand, et al. "Integrated electrometallization for ULSI," Electrochimica Acta 44 (1999), pp. 3639-3649.

Shacham-Diamand, et al. "Material properties of electroless 100-200 nm thick CoWP films," Electrochemical Society Proceedings, vol. 99-34, pp. 102-110.

Ting, et al. "Selective Electroless Metal Deposition for Via Hole Filling in VLSI Multilevel Interconnection Structures," J. Electrochem. Soc., vol. 136, No. 2, Feb. 1989, pp. 462-465.

PCT International Search Report and the Written Opinion for International Application No. PCT/US06/09920 dated Nov. 29, 2006.

* cited by examiner

SEE FIG. 1C

SEE FIG. 1D

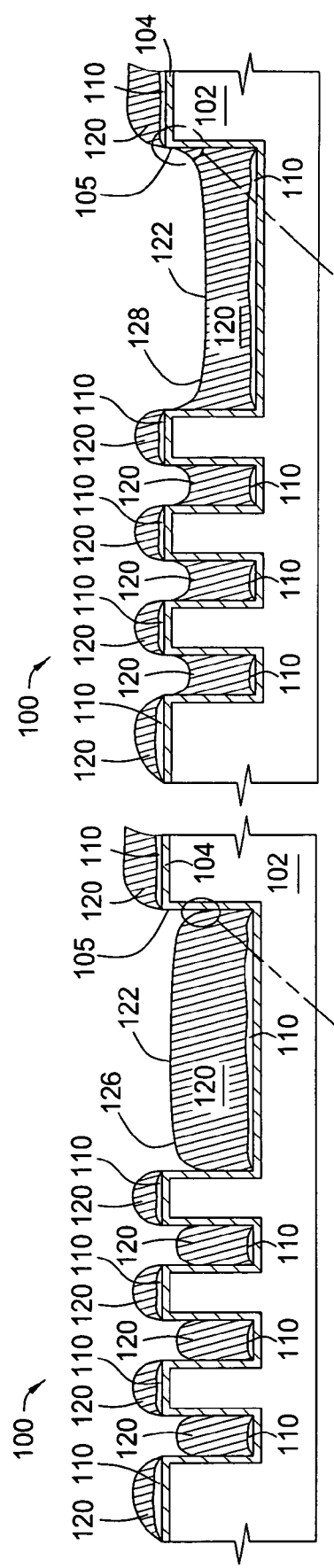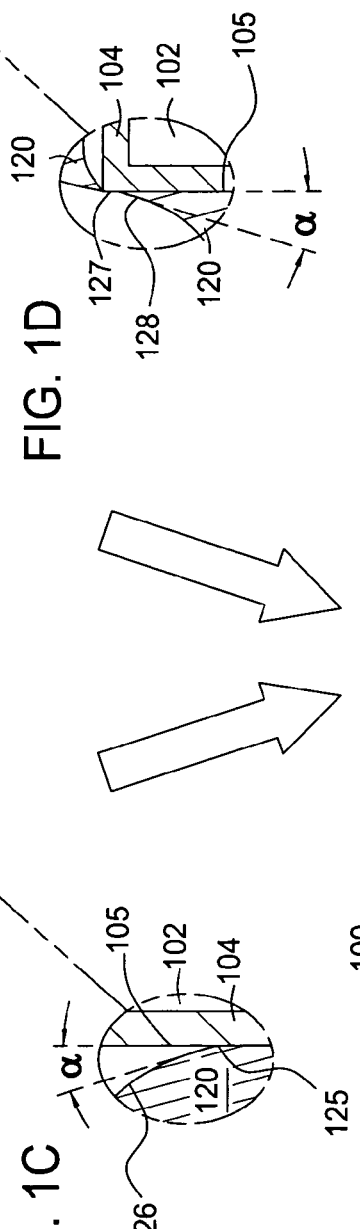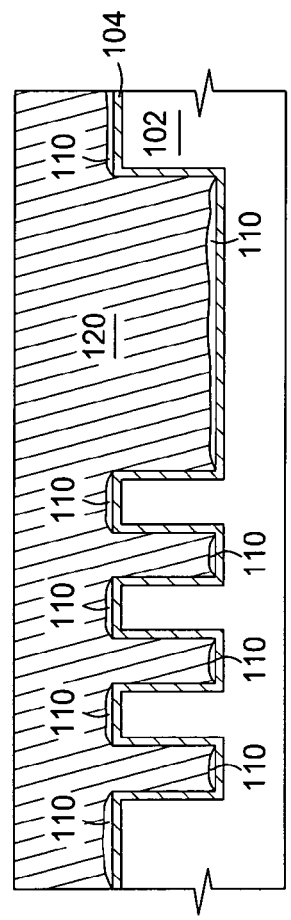
FIG. 1C
FIG. 1D
FIG. 1E

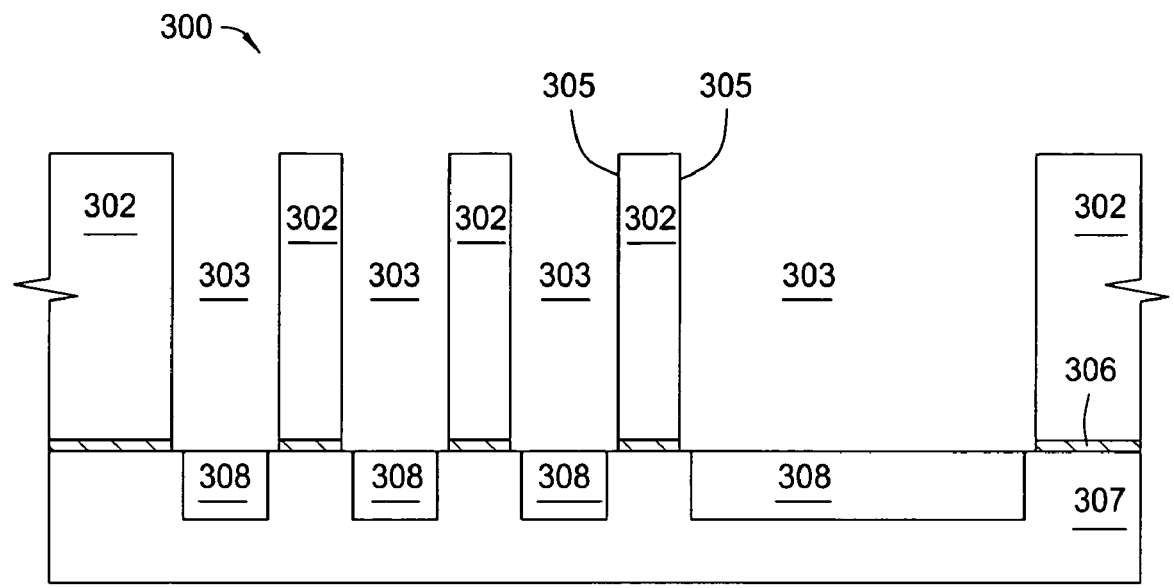
FIG. 3A
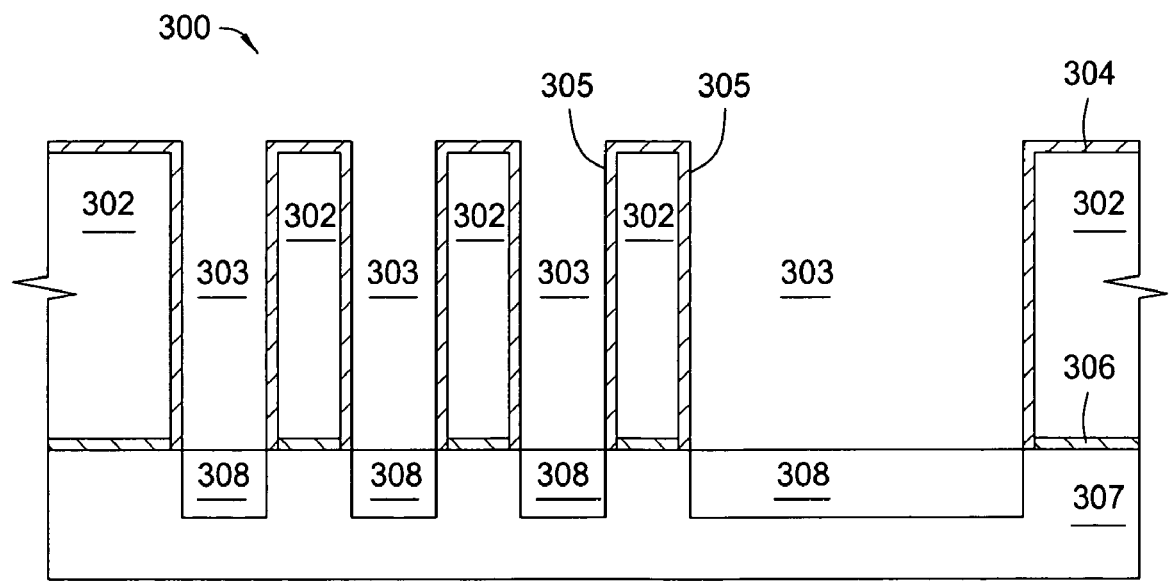
FIG. 3B

PROCESS FOR ELECTROLESS COPPER DEPOSITION

CROSS-REFERENCE TO RELATED APPLICATIONS

This application claims benefit of U.S. Ser. No. 60/663,492, (APPM/009920L), entitled "Electroless Copper Deposition," filed Mar. 18, 2005, which is herein incorporated by reference in its entirety.

BACKGROUND OF THE INVENTION

1. Field of the Invention

Embodiments of the invention generally relate to methods for depositing materials within a feature, and more specifically to methods for depositing a seed layer prior to filling a contact plug with a copper-containing material by an electroless deposition process.

2. Description of the Related Art

Reliably producing nanometer-sized features is one of the key technologies for the next generation of very large scale integration (VLSI) and ultra large scale integration (ULSI) of semiconductor devices. However, as the fringes of circuit technology are pressed, the shrinking dimensions of interconnects in VLSI and ULSI technology have placed additional demands on the processing capabilities. The multilevel interconnects that lie at the heart of this technology require precise processing of high aspect ratio features, such as vias and other interconnects. Reliable formation of these interconnects is very important to VLSI and ULSI success and to the continued effort to increase circuit density and quality of individual substrates.

As circuit densities increase, the widths of vias, apertures, trenches, contacts, and other features, as well as the dielectric layers between them, decrease to nanometer dimensions, whereas the thickness of the dielectric layers remain substantially constant. Therefore, the aspect ratios of the features increase with the duration of time. Many traditional deposition processes have difficulty filling nanometer-sized structures where the aspect ratio exceeds 4:1, and particularly where the aspect ratio exceeds 10:1. Therefore, there is much effort directed at the formation of substantially void-free, nanometer-sized features having high aspect ratios.

Currently, copper and copper alloys have become the metals of choice over aluminum for nanometer-sized interconnect technology. Copper has a lower electrical resistivity (about 1.7 μΩ-cm compared to about 3.1 μΩ-cm for aluminum), a higher current carrying capacity, and significantly higher electromigration resistance than aluminum. These characteristics are important for supporting the higher current densities experienced at high levels of integration and increased device speed. Further, copper has a good thermal conductivity and is available in a highly pure form.

Electroless deposition processes, unlike electroplating processes, utilize autocatalyzed chemical deposition instead of an applied current to induce chemical reduction. An electroless deposition process typically involves exposing a substrate to a solution by either immersing the substrate into a bath or spraying the solution over the substrate. An electroless deposition process of a copper-containing material within nanotechnology requires a surface capable of electron transfer for nucleation of the copper material to occur over the surface, such as a catalytic seed layer. Non-metallic surfaces and oxidized surfaces are examples of surfaces which usually do not support electron transfer. A barrier layer containing tantalum, tantalum nitride, titanium, or titanium nitride may provide for a poor nucleation surface to a subsequently deposited copper-containing material. Native oxides that are easily formed on the barrier layer may cause the poor nucleation.

An electroless deposition process may utilize a seed layer as both a catalytic surface as well as an adhesion surface. A seed layer may serve as a surface capable of electron transfer during an electroless deposition process to deposit copper-containing material. However, if there are discontinuities in the seed layer across the surface, then a subsequently deposited copper-containing layer may not form uniformly to cover the seed layer. A seed layer may also function as an adhesion layer to the underlying barrier layer or contact surface. For example, a copper layer deposited on a tantalum nitride barrier layer without an intermediate adhesion seed layer is easily peeled away during a standard tape test.

Therefore, there exists a need to deposit a seed layer within a feature on a substrate surface prior to filling the feature with a copper-containing material by an electroless deposition process, wherein the seed layer adheres the copper-containing layer to the underlying surface and the copper-containing layer is free of defects.

SUMMARY OF THE INVENTION

In one embodiment of the invention, a method for forming a conductive material within a feature on a substrate is provided which includes selectively depositing a seed layer onto a bottom surface of a feature on a substrate during a collimated physical vapor deposition (PVD) process, and depositing a copper-containing layer on the seed layer to fill the feature during an electroless deposition process. In one example, the sidewalls of the feature are maintained substantially free of the seed metal during the collimated PVD process. The seed layer may contain copper, ruthenium, cobalt, tantalum, titanium, tungsten, rhenium, palladium, platinum, nickel, alloys thereof, or combinations thereof. In one example, the seed metal is deposited on a barrier layer that contains tantalum, tantalum nitride, tantalum silicon nitride, titanium, titanium nitride, titanium silicon nitride, ruthenium, tungsten, tungsten nitride, alloys thereof, derivatives thereof, or combinations thereof. In a preferred example, the seed metal is deposited on a tantalum nitride barrier layer. In other examples, the seed metal is deposited onto contact surfaces.

An electroless solution, used during the electroless deposition process, may contain a copper source and at least one additive, such as an accelerator, a suppressor, or a leveler. The accelerator may be a sulfur-based compound, such as bis(3-sulfopropyl) disulfide, 3-mercapto-1-propane sulfonic acid, or derivatives thereof. The suppressor may include polyethylene glycol, polypropylene glycol, polyoxyethylene-polyoxypropylene copolymer, or derivatives thereof. The leveler may be an alkylpolyimine compound or an organic sulfonate compound, such as 1-(2-hydroxyethyl)-2-imidazolidinethione (HIT), 4-mercaptopyridine, 2-mercaptothiazoline, ethylene thiourea, thiourea, or derivatives thereof. In one example, the concentration of the leveler is adjusted to control the angle in which the surface of a copper-containing layer adjoins the sidewall of a feature. The angle is usually maintained less than 90° from the sidewall, while filling the feature during the deposition process. Preferably, the angle is maintained within a range from about 5° to about 45°.

In another embodiment of the invention, a method for forming a conductive material within a feature on a substrate is provided which includes depositing a seed layer by a PVD process onto a barrier layer disposed on a substrate containing a feature. The method further provides plasma etching a bottom surface of the feature to expose a conductive underlayer while removing a portion of the seed layer and the barrier layer, and depositing a copper-containing layer on the conductive underlayer while filling the feature during an electroless deposition process.

In another embodiment of the invention, a method for forming a conductive material within a feature on a substrate is provided which includes depositing a seed layer onto a barrier layer within a feature that contains sidewalls and a bottom, and depositing a copper-containing layer on the seed layer by an electroless deposition process. The electroless deposition process utilizes a deposition solution containing a leveler at a concentration to form a convexed or concaved copper surface. The copper surface adjoins the sidewall of the feature at an angle less than 90° from the sidewall, and preferably less than about 45°.

In another embodiment of the invention, a method for forming a conductive material within a feature on a substrate is provided which includes depositing a ruthenium seed layer selectively on a contact surface at the bottom of a feature on a substrate by a vapor deposition process, and depositing a copper-containing layer on the ruthenium seed layer while filling the feature during an electroless deposition process. The method further includes maintaining the sidewalls of the feature substantially free of the ruthenium seed layer during the vapor deposition process. In one example, the ruthenium seed layer is formed from ruthenium tetroxide during a vapor deposition process. In one example of the vapor deposition process, a ruthenium oxide layer is initially deposited and subsequently reduced to form the ruthenium seed layer. In another example of the vapor deposition process, ruthenium oxide is concurrently reduced and deposited to form the ruthenium seed layer.

In another embodiment of the invention, a method for forming a conductive material within a feature on a substrate is provided which includes exposing a copper-containing surface within the feature to a process gas containing ruthenium tetroxide to form a ruthenium-containing layer thereon and depositing a copper-containing layer to fill the feature during an electroless deposition process. In one example, a ruthenium oxide layer is formed on the copper-containing surface and subsequently exposed to a reductant to form the ruthenium-containing layer. In another example, the ruthenium oxide layer is concurrently reduced and deposited to form the ruthenium-containing layer. Thereafter, the copper-containing layer is deposited on the ruthenium-containing layer while filling the feature during an electroless deposition process.

In another embodiment of the invention, a method for forming a conductive material within a feature on a substrate is provided which includes selectively depositing a seed layer onto a barrier layer within the feature by a collimated PVD process. The sidewalls of the feature remain substantially free of the seed layer during the collimated PVD process while the seed layer is selectively deposited on the bottom surface of the feature. The method further includes depositing a copper-containing layer on the seed layer while filling the feature during an electroless deposition process. The seed layer may contain copper, ruthenium, cobalt, tantalum, titanium, tungsten, rhenium, palladium, platinum, nickel, alloys thereof, or combinations thereof.

In another embodiment of the invention, a method for forming a conductive material within a feature on a substrate is provided which includes depositing a barrier layer within the feature and plasma etching the bottom surface of the feature to expose a contact surface while removing a portion of the barrier layer. The method further includes exposing the contact surface to a process gas containing ruthenium tetroxide to form a ruthenium-containing layer thereon, and filling the feature with a copper-containing layer during an electroless deposition process.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of the invention and are therefore not to be considered limiting of its scope, for the invention may admit to other equally effective embodiments.

FIGS. 1A-1E illustrate schematic cross-sectional views of integrated circuits formed by deposition processes described within embodiments herein;

FIGS. 3A-3D illustrate schematic cross-sectional views of integrated circuits formed by other deposition processes described within embodiments herein.

DETAILED DESCRIPTION

Embodiments of the invention provide methods for forming conductive materials within an aperture of a feature on a substrate surface. In one example, the method provides depositing a seed layer within the feature by a vapor deposition process. The seed layer may contain copper, ruthenium, cobalt, tantalum, titanium, tungsten, rhenium, palladium, platinum, nickel, alloys thereof, or combinations thereof. Once the seed layer has been deposited, the feature may be bottom up filled with a copper-containing material during an electroless deposition process. The electroless deposition process may employ an innovative copper deposition solution to ensure that features are free of defects, such as voids or seams. The seed layer may be deposited directly onto a contact surface or on a barrier layer.

In one embodiment, the seed layer is selectively deposited by a collimated physical vapor deposition (PVD) process on the bottom surface of the feature while maintaining the sidewalls of the feature substantially free of the seed material. In another embodiment, the seed layer is conformably deposited across the substrate surface and features therein by a PVD process. Subsequently, the bottom surfaces of the features are plasma etched to expose an underlying contact surface while removing a portion of the seed layer and underlying layer. In another embodiment, a ruthenium seed layer is deposited on an exposed contact surface within a feature. Preferably, the ruthenium seed layer is formed by initially depositing a ruthenium oxide layer on the contact surface during an atomic layer deposition (ALD) process or a chemical vapor deposition (CVD) process utilizing the chemical precursor ruthenium tetroxide. The ruthenium oxide layer may be chemically reduced to form a ruthenium-containing layer either during the vapor deposition process or thereafter.

In another embodiment, an electroless solution containing a copper source and at least one additive may be used during the electroless deposition process. The additives include an accelerator, a suppressor, or a leveler. The accelerator may be a sulfur-based compound, such as bis(3-sulfopropyl) disulfide, 3-mercapto-1-propane sulfonic acid, derivatives thereof, or combinations thereof. The suppressor may include polyethylene glycol, polypropylene glycol, polyoxyethylene-polyoxypropylene copolymer, or derivatives thereof. The leveler may be an alkylpolyimine compound or an organic sulfonate compound, such as 1-(2-hydroxyethyl)-2-imidazolidinethione (HIT), 4-mercaptopyridine, 2-mercaptothiazoline, ethylene thiourea, thiourea, or derivatives thereof. The leveler concentration may be adjusted to control the angle that the surface of the copper-containing layer meets or adjoins the sidewall of the feature. The angle is usually maintained less than 90° from the sidewall while filling the feature during the electroless deposition process.

Figure 1A:
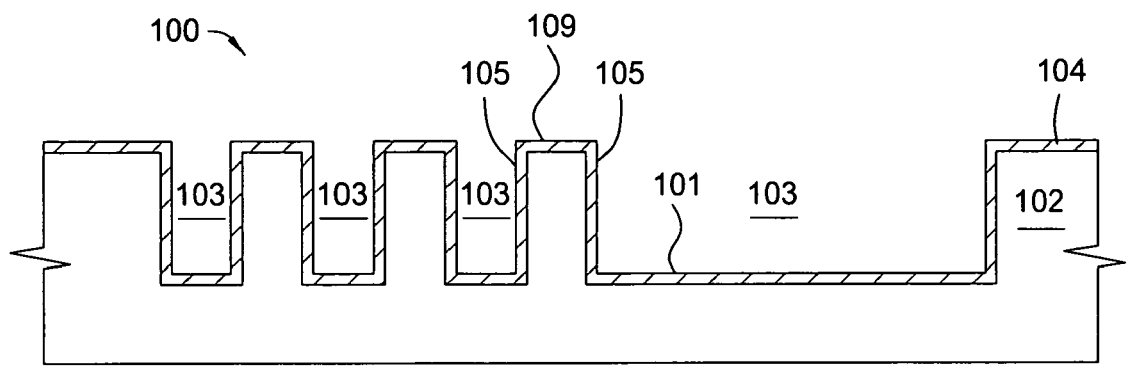

FIG. 1A illustrates a cross-sectional view of substrate 100 containing dielectric layer 102 and apertures 103 formed therein. Apertures 103 may include features, such as vias, trenches, or contact holes. Barrier layer 104 deposited on substrate 100 covers bottom surface 101 and sidewalls 105 of each aperture 103. Dielectric layer 102 may contain a semiconductor material that includes silicon or silicon-containing materials, such as silicon germanium, silicon dioxide, silicon nitride, silicon on insulator (SOI), doped silicon, fluorine-doped silicate glass (FSG), silicon oxynitride, or carbon doped silicon oxides, such as $SiO_xC_y$, for example, BLACK DIAMOND® low-k dielectric, available from Applied Materials, Inc., located in Santa Clara, Calif. In one example, apertures 103 containing sidewalls 105 may be formed in dielectric layer 102 by techniques well known in the art, such as a mask and etch process. In one example, apertures 103 may be formed to reveal conductive contacts (not shown) within substrate 100.

Barrier layer 104 may be deposited by a vapor deposition process, such as a PVD process, an ALD process, a CVD process, an electroless deposition process, or combinations thereof. Barrier layer 104 may contain a single layer of one material or multiple layers of varying materials. Barrier layer 104 may contain tantalum, tantalum nitride, tantalum silicon nitride, titanium, titanium nitride, titanium silicon nitride, ruthenium, tungsten, tungsten nitride, alloys thereof, derivatives thereof, or combinations thereof. Examples provide barrier layer 104 containing tantalum and/or tantalum nitride. In one example, barrier layer 104 is formed by depositing a tantalum layer by a PVD process onto a tantalum nitride layer deposited by an ALD process. In another example, barrier layer 104 is formed by depositing a tantalum layer by a PVD process onto a tantalum nitride layer deposited by a PVD process. In another example, barrier layer 104 is formed by depositing a tantalum layer by an ALD process onto a tantalum nitride layer deposited by an ALD process.

Figure 1B:
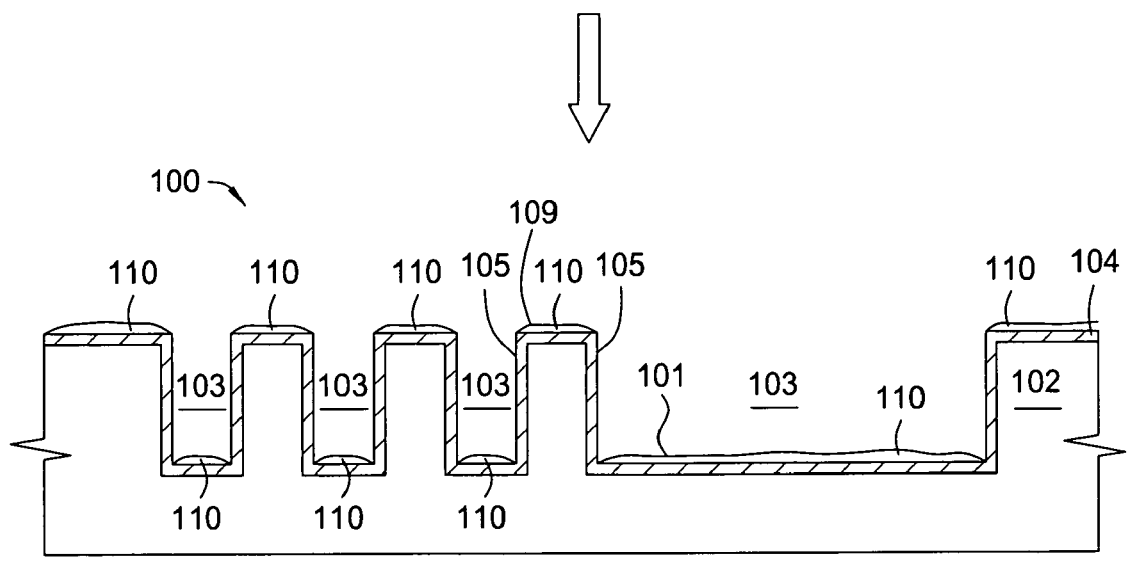

FIG. 1B depicts seed layer 110 deposited on substrate 100. Seed layer 110 is selectively deposited onto barrier layer 104 at bottom surfaces 101 of apertures 103 and across field 109 of substrate 100 by a collimated PVD process. Sidewalls 105 of apertures 103 remain substantially free of seed layer 110 during and after the collimated PVD process. Seed layer 110 contains a metal selected from copper, ruthenium, cobalt, tantalum, titanium, tungsten, rhenium, palladium, platinum, nickel, alloys thereof, or combinations thereof. In one example, a PVD process deposits sputtered target atoms on the barrier layer 104 to form a continuous seed layer 110. Use of a vacuum deposition process, such as a PVD deposition process, provides for a strong interfacial bond between seed layer 110 and barrier layer 104, and thus improves adhesion between the layers. Also, seed layer 110 provides a catalytic surface to subsequently form copper-containing layer 120 thereon. Seed layer 110 may have a thickness within a range from about a single atomic layer to about 50 Å. Seed layer 110 may be discontinuous, but preferably continuous across bottom surfaces 101 of apertures 103.

In one example of a collimated PVD process for depositing seed layer 110, argon is admitted into the process chamber containing substrate 100 and the power supply is turned "on" to form an argon plasma. Positive argon ions thereby are generated, and a target of selected material is biased negatively relative to the grounded shield. These positively charged argon ions are attracted to the negatively charged target, and strike the target with sufficient energy to cause target atoms to be sputtered from the target. The sputtered atoms that strike substrate 100 are deposited on barrier layer 104 to form seed layer 110 of the target material. The PVD process is typically performed in a chamber having pressure within a range from about 0.1 mTorr to about 2.0 mTorr. The power applied to the target may be, for example, about 18 kW and the RF bias signal applied to the pedestal containing substrate 100 may be about 250 W or less.

Seed layer 110 may contain a variety of metals deposited by PVD processes utilizing targets or sources composed of copper, ruthenium, cobalt, tantalum, titanium, tungsten, rhenium, palladium, platinum, nickel, alloys thereof, or combinations thereof. Seed layer 110 may be deposited by a self ionizing plasma (SIP) chamber, such as a SIP ENCORE™ chamber or an ionized metal plasma (IMP) chamber, such as a VECTRA IMP SOURCE® chamber, each available from Applied Materials, Inc., located in Santa Clara, Calif. Further description of the PVD chambers that may be used to deposit seed layer 110 is disclosed in commonly assigned U.S. Pat. Nos. 6,784,096, 6,277,249, and 6,251,242, which are herein incorporated by references in their entirety. Magnetrons may be utilized to produce an asymmetric magnetic field which extends deep into the plasma chamber to enhance the ionization density of the plasma, as disclosed in commonly assigned U.S. Pat. No. 6,183,614, which is herein incorporated by reference in its entirety.

Electroless deposition is a process for depositing conductive materials over a catalytically active surface by chemical reduction in the absence of an external electric current. Electroless deposition processes selectively deposit at locations where a catalytic material already exists, such as seed layer 110. Also, electroless processes are self-perpetuating to the extent of the availability of the electroless deposition solution and other reactive conditions. Therefore, electroless deposition processes are herein discussed in context for depositing copper-containing layers throughout embodiments of the invention.

FIGS. 1C and 1D illustrate copper-containing layer 120 deposited on seed layer 110 by several embodiments described herein. Copper-containing layer 120 is deposited by an electroless deposition process to bottom up fill apertures 103, such as from bottom surface 101 to field 109. Apertures 103 are filled with copper-containing material while avoiding defects (e.g., seams, voids, or gaps) within copper-containing layer 120. The electroless deposition process utilizes an electroless solution containing a copper source and at least one additive, such as an accelerator, a suppressor, or a leveler. FIG. 1E illustrates substrate 100 lacking free space or void within aperture 103 which has been filled with copper-containing layer 120. Copper-containing layer 120 contains pure copper or a copper alloy.

Copper-containing layer 120 may have convexed surface 126 (FIG. 1C) or concaved surface 128 (FIG. 1D). During the electroless deposition process, the surface of copper-containing layer 120 adjoins sidewall 105 at vertex 125 or vertex 127 having an angle α of less than 90° from sidewall 105. Angle α is typically within a range from about 5° to about 45° and is adjusted proportionally by the leveler concentration within the electroless solution. In one embodiment, depicted in FIG. 1C, angle α is less than 90° from sidewall 105 while vertex 125 of angle α is below point 122 at the center highest portion of convexed surface 126. In another embodiment, depicted in FIG. 1D, angle α may also be less than 90° from sidewall 105 while vertex 127 of angle α is above point 122 at the center lowest portion of concaved surface 128. Angle α is preferably maintained at an angle having an absolute value within a range from about 5° to about 45° during the electroless deposition process to minimize or exclude defects forming within copper-containing layer 120 while promoting a bottom up growth. In one embodiment, angle α may have an angle of less than 90° from sidewall 105, such as within a range from about 5° to about 60°, preferably, from about 5° to about 45°, and more preferably, from about 5° to about 30°.

The electroless deposition solution is an aqueous solution that contains a copper source, a reductant, a complexing agent, a pH adjusting agent, additives (e.g., levelers) and an optional surfactant used as a wetting agent. Levelers within the electroless solution are used to achieve different deposition thickness as a function of leveler concentration and feature geometry by controlling angle α while depositing copper-containing layer 120. The electroless deposition solution may contain a leveler at concentration within a range from about 20 parts per billion (ppb) to about 600 parts per million (ppm), preferably, from about 100 ppb to about 100 ppm. Examples of levelers that may be employed in an electroless solution include, but are not limited to, alkylpolyimines and organic sulfonates, such as 1-(2-hydroxyethyl)-2-imidazolidinethione (HIT), 4-mercaptopyridine, 2-mercaptothiazoline, ethylene thiourea, thiourea, or derivatives thereof.

The electroless deposition solution may contain brighteners or accelerators and suppressors as alternative additives to provide further control of the deposition process. Accelerators help to provide a smoothly deposited surface of the copper-containing layer 120. The electroless deposition solution may contain an accelerator at a concentration within a range from about 20 ppb to about 600 ppm, preferably, from about 100 ppb to about 100 ppm. Accelerators that are useful in an electroless solution for depositing copper-containing layer 120 may include sulfur-based compounds such as bis (3-sulfopropyl) disulfide (SPS), 3-mercapto-1-propane sulfonic acid (MPSA), aminoethane sulfonic acids, thiourea, derivatives thereof, or combinations thereof. Suppressors are used to suppress copper deposition by initially adsorbing onto underlying catalytic surfaces (e.g., seed layer 110) and therefore blocking access to the catalyst of the reaction. Suppressors may include polyethylene glycol (PEG), polypropylene glycol (PPG), polyoxyethylene-polyoxypropylene copolymer (POCP), benzotriazole (BTA), dipyridyl, dimethyl dipyridyl, derivatives thereof, or combinations thereof. The electroless deposition solution may contain a suppressor at a concentration within a range from about 20 ppb to about 600 ppm, preferably, from about 100 ppb to about 100 ppm.

Copper sources provide copper ions (e.g., $Cu^{1+}$ or $Cu^{2+}$) dissolved within the electroless solution to be reduced out as the deposited copper-containing material. Useful copper sources include copper sulfate, copper chloride, copper acetate, copper phosphate, derivatives thereof, hydrates thereof, or combinations thereof. The electroless deposition solution may contain a copper source at a concentration within a range from about 5 mM to about 100 mM, preferably, from about 25 mM to about 75 mM.

Reductants provide electrons to induce chemical reduction of the copper ions that form and deposit the copper-containing material. Reductants may include organic reductants (e.g., formaldehyde or glyoxylic acid), hydrazine, organic hydrazines (e.g., methyl hydrazine), hypophosphite sources (e.g., hypophosphorous acid ($H_3PO_2$), ammonium hypophosphite (($NH_4)_{4-x}H_xPO_2$) or salts thereof), borane sources (e.g., dimethylamine borane complex (($CH_3)_2NH.BH_3$), DMAB), trimethylamine borane complex (($CH_3)_3N.BH_3$), TMAB), tert-butylamine borane complex ($^tBuNH_2.BH_3$), tetrahydrofuran borane complex ($THF.BH_3$), pyridine borane complex ($C_5H_5N.BH_3$), ammonia borane complex ($NH_3.BH_3$), borane ($BH_3$), diborane ($B_2H_6$), derivatives thereof, complexes thereof, or combinations thereof. The electroless deposition solution may contain a reductant at a concentration within a range from about 10 mM to about 2 M, preferably, from about 20 mM to about 500 mM.

Chelators or complexing agents are in the electroless solution to complex copper ions thereby stabilizing the solubility and reduction of copper ions. Complexing agents generally may have functional groups, such as amino acids, carboxylic acids, dicarboxylic acids, polycarboxylic acids, amino acids, amines, diamines, polyamines, alkylamines, alkanolamines and alkoxyamines. Useful complexing agents include citric acid, citrates, glycolic acid, glycine, malonic acid, maleic acid, lactic acid, ethylenediaminetetraacetic acid (EDTA), ethylenediamine (EDA), triethylenetetramine (TETA), diaminoethane, monoethanolamine, diethanolamine (DEA), triethanolamine (TEA), hydroxylamine hydrochloride, ammonia, ammonium chloride, derivatives thereof, salts thereof, or combinations thereof. The electroless deposition solution may contain complexing agents at a concentration within a range from about 10 mM to about 2 M, preferably, from about 20 mM to about 300 mM.

A pH adjusting agent may be added to adjust the electroless solution to a pH value within a range from about 4 to about 14. The pH adjusting agent may be an acidic compound to decrease the pH value of the electroless solution and include hydrochloric acid, sulfuric acid, phosphoric acid, derivatives thereof, or combinations thereof. Alternatively, the pH adjusting agent may be a basic compound to increase the pH value of the electroless solution and include metal hydroxides (e.g., $Cu(OH)_2$), tetraalkylammonium hydroxides (e.g., tetramethylammonium hydroxide (($CH_3)_4NOH$, TMAH) or tetraethylammonium hydroxide (($CH_3CH_2)_4NOH$, TEAH)), ammonium hydroxide, DEA, TEA, derivatives thereof, or combinations thereof. The pH adjusting agent may be dissolved in water prior to adjusting the pH value of the electroless solution. In one example, an electroless copper solution has a pH value of greater than 7, such as within a range from about 9 to about 14, preferably, from about 10 to about 13.5, and more preferably, from about 11 to about 13.

Also, an optional surfactant may be added to the electroless solution. The surfactant is a wetting agent to reduce the surface tension between the plating solution and the substrate surface. The electroless solution may contain a surfactant at a concentration of about 1,000 ppm or less, preferably, about 800 ppm or less, such as within a range from about 20 ppb to about 600 ppm. The surfactant may have ionic or non-ionic characteristics. A preferred surfactant includes dodecyl sulfates, such as sodium dodecyl sulfate (SDS). Other surfactants that may be used in the electroless deposition solution include glycol ether based surfactants (e.g., polyethylene glycol or PEG-PPG-PEG). For example, a glycol ether based surfactants may contain polyoxyethylene units, such as TRITON® 100, available from Dow Chemical Company. A non-ylphenol ethoxylate surfactant is useful in the electroless deposition solution, such as TERGITOL®, available from Dow Chemical Company or IGEPAL-630, available from GAF Corporation. Other useful surfactants may contain phosphate units, for example, sodium poly(oxyethylene) phenyl ether phosphate, such as RHODAFAC® RE-610, available from Rhodia, Inc. The surfactants may be single compounds or a mixture of compounds of molecules containing varying length of hydrocarbon chains.

The electroless deposition process to deposit copper-containing layers may use either a pre-mixed electroless solution or an electroless solution formed by an in-line mixing process that combines componential solution. The electroless deposition process may be conducted at a temperature within a range from about 35° C. to about 80° C. Platforms, systems, cells, or chambers that may be useful for conducting electroless deposition processes, as described herein for depositing copper-containing layers, are further disclosed in commonly assigned U.S. Ser. No. 10/059,572, entitled "Electroless Deposition Apparatus," filed Jan. 28, 2002, and published as US 2003-0141018, U.S. Ser. No. 10/965,220, entitled, "Apparatus for Electroless Deposition," filed on Oct. 14, 2004, and published as US 2005-0081785, U.S. Ser. No. 10/996,342, entitled, "Apparatus for Electroless Deposition of Metals on Semiconductor Wafers," filed on Nov. 22, 2004, and published as US 2005-0160990, U.S. Ser. No. 11/043,442, entitled, "Apparatus for Electroless Deposition of Metals on Semiconductor Wafers," filed on Jan. 26, 2005, and published as US 2005-0263066, and U.S. Ser. No. 11/175,251, entitled, "Apparatus for Electroless Deposition of Metals on Semiconductor Wafers," filed on Jul. 6, 2005, and published as US 2005-0260345, which are each incorporated by reference to the extent not inconsistent with the claimed aspects and description herein.

Figure 2A:
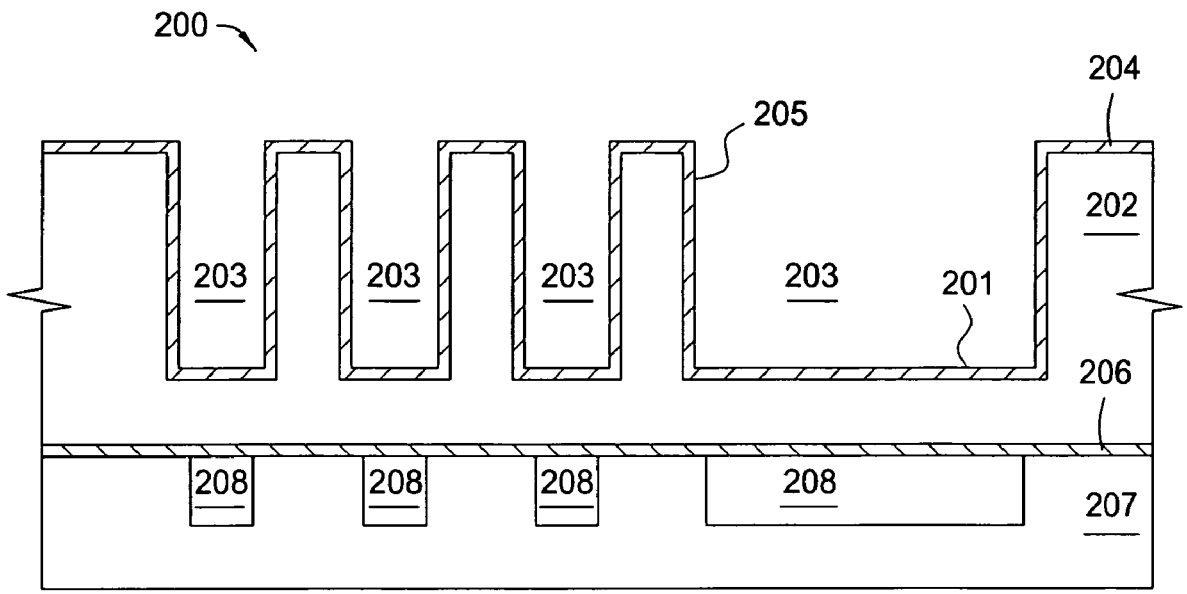
FIGS. 2A-2D illustrate schematic cross-sectional views of integrated circuits formed by other deposition processes described within embodiments herein.

FIG. 2A illustrates a cross-sectional view of substrate 200 containing conductive contacts 208 formed within dielectric layer 207 and capped with barrier layer 206. Substrate 200 further contains barrier layer 204 disposed over dielectric layer 202 and apertures 203 formed therein. Apertures 203 may include features, such as vias, trenches, or contact holes. Barrier layer 204 covers sidewalls 205 and bottom surfaces 201 of apertures 203.

Dielectric layers 202 and 207 may contain a semiconductor material that includes silicon or silicon-containing materials such as silicon germanium, silicon dioxide, silicon nitride, SOI, doped silicon, FSG, silicon oxynitride, or carbon doped silicon oxides, such as $SiO_xC_y$, for example, BLACK DIAMOND® low-k dielectric, available from Applied Materials, Inc., located in Santa Clara, Calif. Apertures 203 may be formed in dielectric layer 202 by techniques well known in the art, such as a mask and etch process. Conductive contacts 208 contain a metal that includes copper, tungsten, aluminum, silver, alloys thereof, or derivatives thereof. Although not shown, conductive contacts 208 are usually encompassed by at least one barrier material to prevent diffusion of the conductive material into neighboring dielectric layer 207.

Barrier layer 204 may be deposited by a vapor deposition process, such as a PVD process, an ALD process, a CVD process, or combinations thereof. Barrier layer 204 may contain a single layer of one material or multiple layers of different materials. Barrier layers 204 and 206 may independently contain tantalum, tantalum nitride, tantalum silicon nitride, titanium, titanium nitride, titanium silicon nitride, ruthenium, tungsten, tungsten nitride, silicon nitride, alloys thereof, derivatives thereof, or combinations thereof. Preferably, barrier layer 204 contains tantalum and/or tantalum nitride. In one example, barrier layer 204 is formed by depositing a tantalum layer by a PVD process onto a tantalum nitride layer deposited by an ALD process. In another example, barrier layer 204 is formed by depositing a tantalum layer by a PVD process onto a tantalum nitride layer deposited by a PVD process. In another example, barrier layer 204 is formed by depositing a tantalum layer by an ALD process onto a tantalum nitride layer deposited by an ALD process.

Figure 2B:
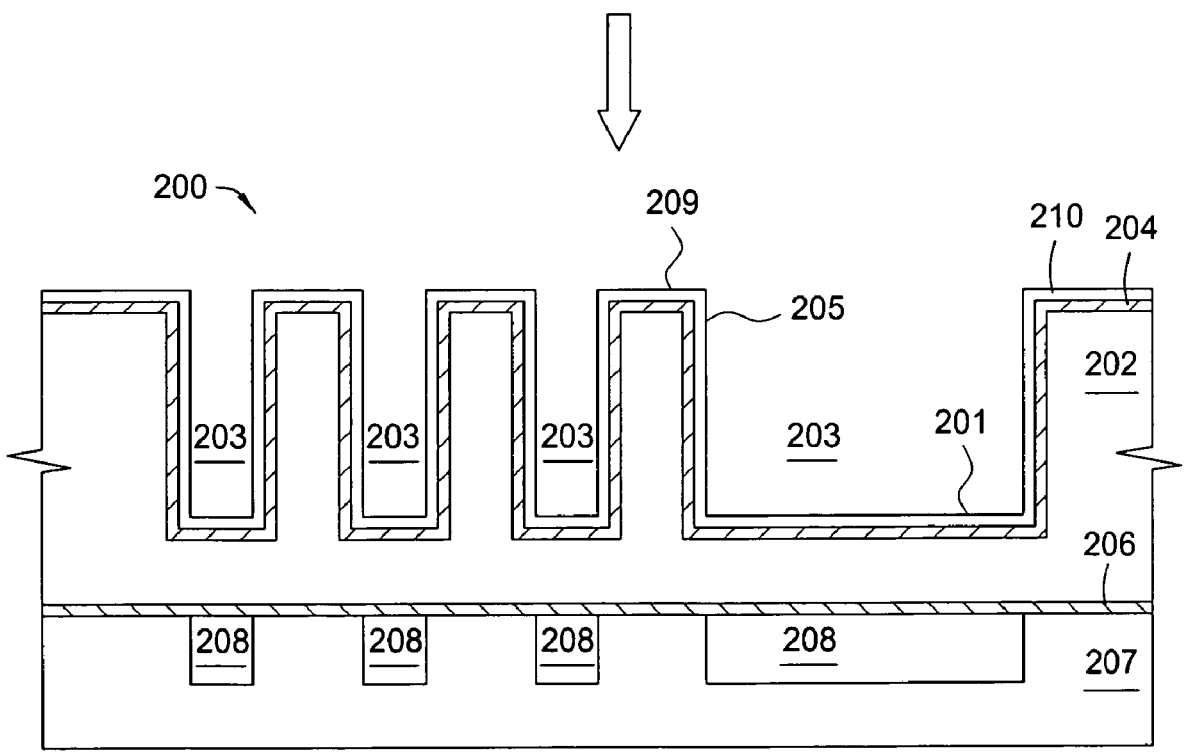

FIG. 2B depicts seed layer 210 deposited on substrate 200. Seed layer 210 is deposited onto barrier layer 204 including bottom surfaces 201 and sidewalls 205 of apertures 203 and across field 209 of substrate 200 by a PVD process. Alternatively, seed layer 210 may be deposited by an ALD process or a CVD process. Seed layer 210 may contain copper, ruthenium, cobalt, tantalum, titanium, tungsten, rhenium, palladium, platinum, nickel, alloys thereof, or combinations thereof. In one embodiment, the PVD process deposits sputtered target atoms on the barrier layer 204 to form a continuous seed layer 210. Use of a vacuum deposition process, such as a PVD deposition process, provides for a strong interfacial bond between seed layer 210 and the barrier layer 204, and thus improves adhesion between the layers. Also, seed layer 210 provides a catalytic surface to form copper-containing layer 220 thereon. Seed layer 210 may be formed having a thickness within a range from about a single atomic layer to about 50 Å. Seed layer 210 may be discontinuous, but preferably continuous across barrier layer 204.

In one example of a PVD process for depositing seed layer 210, argon is admitted into the process chamber containing substrate 200 and the power supply is turned "on" to form an argon plasma. Positive argon ions thereby are generated, and a target of selected material is biased negatively relative to the grounded shield. These positively charged argon ions are attracted to the negatively charged target, and strike the target with sufficient energy to cause target atoms to be sputtered from the target. The sputtered atoms that strike substrate 200 are deposited on barrier layer 204 to form seed layer 210 of the target material. The PVD process is typically performed in a chamber at a pressure within a range from about 0.1 mTorr to about 2.0 mTorr. The power applied to the target may be, for example, about 18 kW and the RF bias signal applied to the pedestal containing substrate 200 may be about 250 W or less.

Seed layer 210 may contain a variety of metals deposited by PVD processes utilizing targets or sources composed of copper, ruthenium, cobalt, tantalum, titanium, tungsten, rhenium, palladium, platinum, nickel, alloys thereof, or combinations thereof. Seed layer 210 may be deposited by a self ionizing plasma (SIP) chamber, such as a SIP ENCORE™ chamber or an ionized metal plasma (IMP) chamber, such as a VECTRA IMP SOURCE® chamber, each available from Applied Materials, Inc., located in Santa Clara, Calif. Magnetrons may be utilized to produce an asymmetric magnetic field which extends deep into the plasma chamber to enhance the ionization density of the plasma.

Figure 2C:
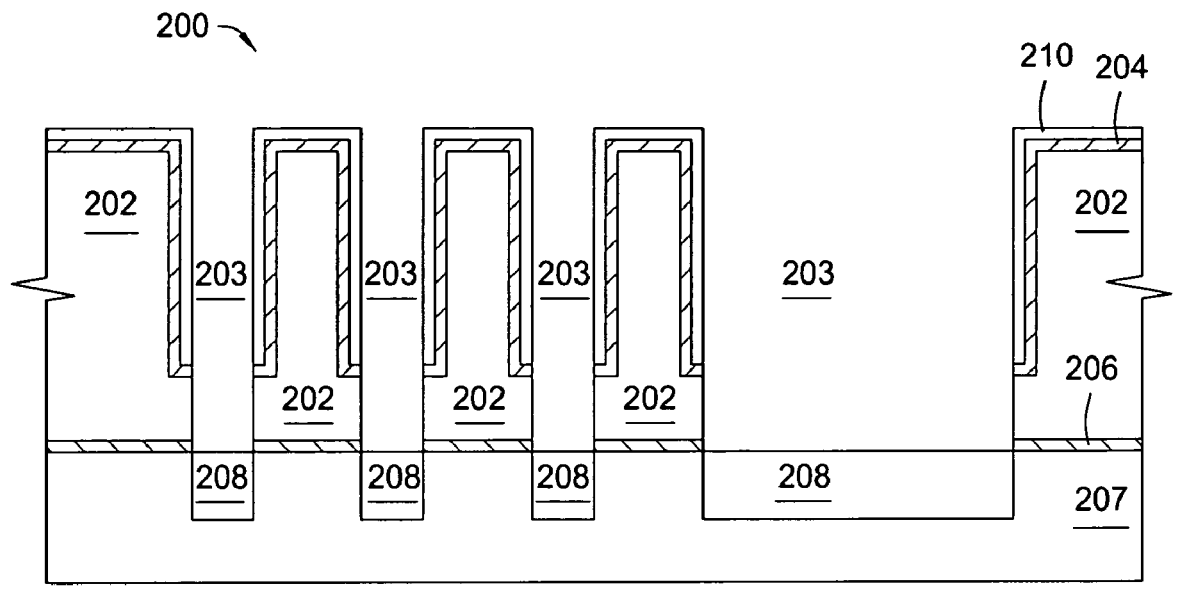

FIG. 2C depicts substrate 200 after being exposed to a plasma etch process to increase the depth of apertures 203 and reveal contacts 208. Plasma etch processes may include a re-sputter process conducted in a PVD chamber as described herein or in a process chamber equipped with a remote plasma system (RPS) or a remote plasma clean (RPC) unit that is adapted to perform a dry etch process. A plasma etch process may be performed in a DPS® CENTURA® etch chamber or an E-MAX® CENTURA® etch chamber available from Applied Materials, Inc., located in Santa Clara, Calif. Material from seed layer 210 and barrier layer 204 at bottom surface 201 of apertures 203 is removed during the plasma etch process. Material from dielectric layer 202 and barrier layer 206 that is aligned between apertures 203 and contacts 208 is also removed during the plasma etch process.

In one example, the plasma etch process is performed by flowing an inert gas (e.g., argon) into a PVD chamber and striking a plasma. The PVD chamber may be maintained at a pressure within a range from about 0.5 mTorr to about 30 mTorr. During the plasma etch process, the target, the pedestal, and the coil are suitably biased to generate a plasma within the chamber. For example, a power signal may be applied to the coil via the RF power supply, little or no power may be applied to the target by the DC power supply and a negative bias may be applied to the pedestal (e.g., via the RF power supply) containing substrate 200. The RF power signal applied to the coil causes argon atoms within the chamber to ionize and form a plasma. By adjusting the duty cycle and/or magnitude of the RF power signal applied to the pedestal, a negative bias may be created between the pedestal and the plasma. The negative bias between the pedestal and the plasma causes argon ions to accelerate toward the pedestal and substrate 200 supported thereon. Accordingly, substrate 200 is sputter-etched by the argon ions.

Under the influence of the negative bias applied to the pedestal, the argon ions strike substrate 200 substantially perpendicularly. Further, the high ion density generated by the PVD chamber, typically greater than $10^{10}$, $10^{11}$ or $10^{12}$ ions/cm$^3$, may increase the anisotropic nature of the sputter-etch process. Such a high degree of anisotropy is especially beneficial, and in some cases essential, to form narrow width, high aspect ratio features (e.g., aperture feature having aspect ratios of about 4:1 or greater and/or apertures widths of about 65 nm or less).

Little or no material is sputtered from the target and deposits on substrate 200 during the plasma etch process, since little or no power is applied to the target (e.g., from about 0 W to about 500 W). Portions of seed layer 210, barrier layers 204 and 206, and dielectric layer 202 are removed at each bottom surface 201 of each aperture 203. In one example, sputter etching is performed within a PVD chamber at a pressure within a range from about 0.5 mTorr to about 30 mTorr, a pedestal bias within a range from about 400 W to about 1,000 W at about 13.56 MHz, a coil power within a range from about 1 kW to about 5 kW at about 2 MHz, a target power of less than about 500 W, and a target/substrate spacing of about 400 mm.

In another example, a plasma etch process is conducted in an ALD chamber or a CVD chamber equipped with an RPC unit. The RPC unit generates and emits a plasma (e.g., argon plasma) into the deposition chamber to remove material from the substrate 200. Therefore, a single process chamber (e.g., PVD, ALD or CVD chamber) may be used to deposit barrier layer 204 and/or seed layer 210, as well as to plasma etch substrate 200 thereafter. Alternatively, the deposition of barrier layer 204, the deposition of seed layer 210, and the plasma etch of substrate 200 may be performed independently within individual process chambers.

Figure 2D:
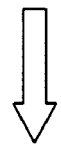
Figure 2D:
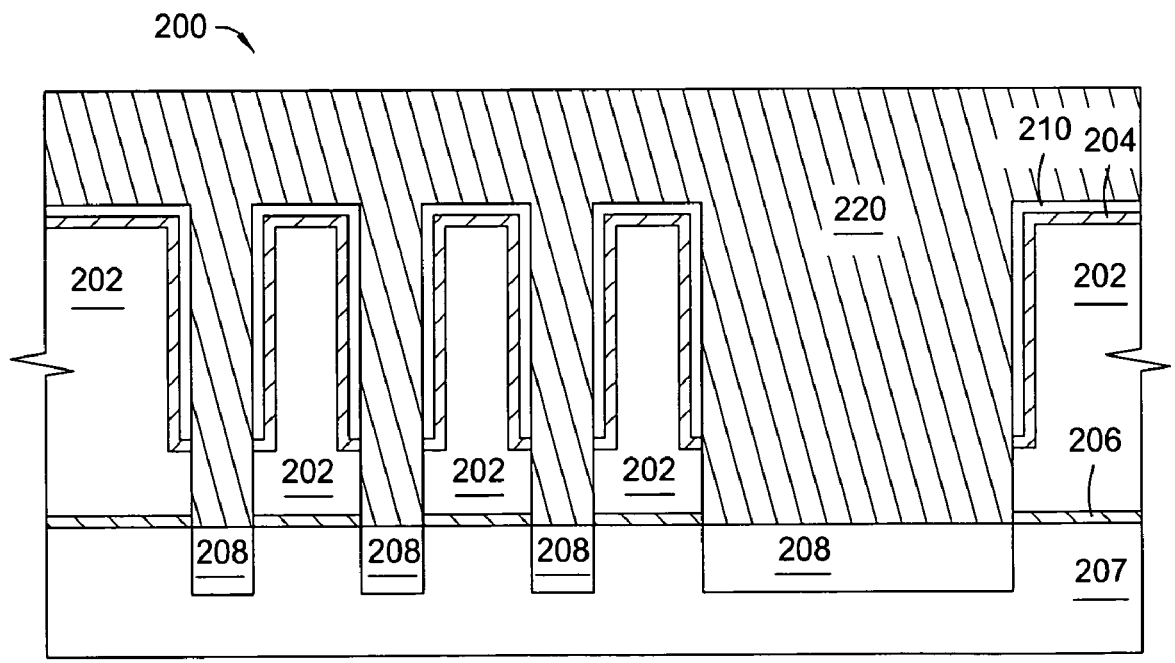

FIG. 2D illustrates copper-containing layer 220 deposited on seed layer 210 by an electroless deposition process which fills apertures 203 from the bottom up. Apertures 203 are filled with copper-containing material while avoiding defects (e.g., seams, voids, or gaps) within copper-containing layer 220. The electroless deposition process utilizes an electroless solution containing a copper source and at least one additive, such as an accelerator, a suppressor, a leveler and combinations thereof. Copper-containing layer 220 contains copper or a copper alloy and is deposited according to electroless deposition processes and solutions previously discussed that may be used to form copper-containing layer 120. In one embodiment, copper-containing layer 220 may have a convexed copper surface or a concaved copper surface, as described similarly for copper-containing layer 120 having convexed surface 126 (FIG. 1C) or concaved surface 128 (FIG. 1D).

The convexed/concaved copper surfaces may adjoin sidewalls 205 at an angle of less than 90° from sidewall 205, such as within a range from about 5° to about 60°, preferably, from about 5° to about 45°, and more preferably, from about 5° to about 30°.

In alternative embodiments, FIGS. 3A-3D and 4A-4D illustrate cross-sectional views of substrates 300 and 400 during deposition processes to form conductive materials thereon. The deposition processes include forming a ruthenium seed layer on the surface of a conductive contact within a feature. Preferably, the ruthenium seed layer is formed by a vapor deposition process utilizing ruthenium tetroxide ($RuO_4$) as a precursor. During the deposition process, a ruthenium oxide layer may be deposited and subsequently and/or concurrently chemically reduced to form the ruthenium seed layer. Thereafter, a copper-containing layer is deposited by an electroless deposition process to fill the feature.

FIG. 3A illustrates a cross-sectional view of substrate 300 containing conductive contacts 308 formed within dielectric layer 307, capped with barrier layer 306 and dielectric layer 302 disposed thereon. Features, such as vias, trenches or apertures 303, are formed within substrate 300 to expose contacts 308. Apertures 303 further contain sidewalls 305.

FIG. 3B depicts barrier layer 304 selectively deposited on sidewalls 305 of apertures 303 and across the field of substrate 300 by a vapor deposition process, while not deposited on the surfaces of conductive contacts 308. Barrier layer 304 may be selectively deposited by a vapor deposition process, such as an ALD process, a CVD process, a PVD process, or a combination thereof. In one example, barrier layer 304 is formed by depositing a tantalum nitride layer by a selective ALD process. The selective ALD process may include pre-treatment of substrate 300 to form a sacrificial layer on the surface of conductive contacts 308. During the sequential cycles for depositing barrier layer 304, the sacrificial layer may be etched away by one of the ALD precursors. Alternatively, after the ALD process, the sacrificial layer may be removed from the surface of conductive contacts 308 by an etch process, such as a plasma etch process described herein.

Figure 4A:
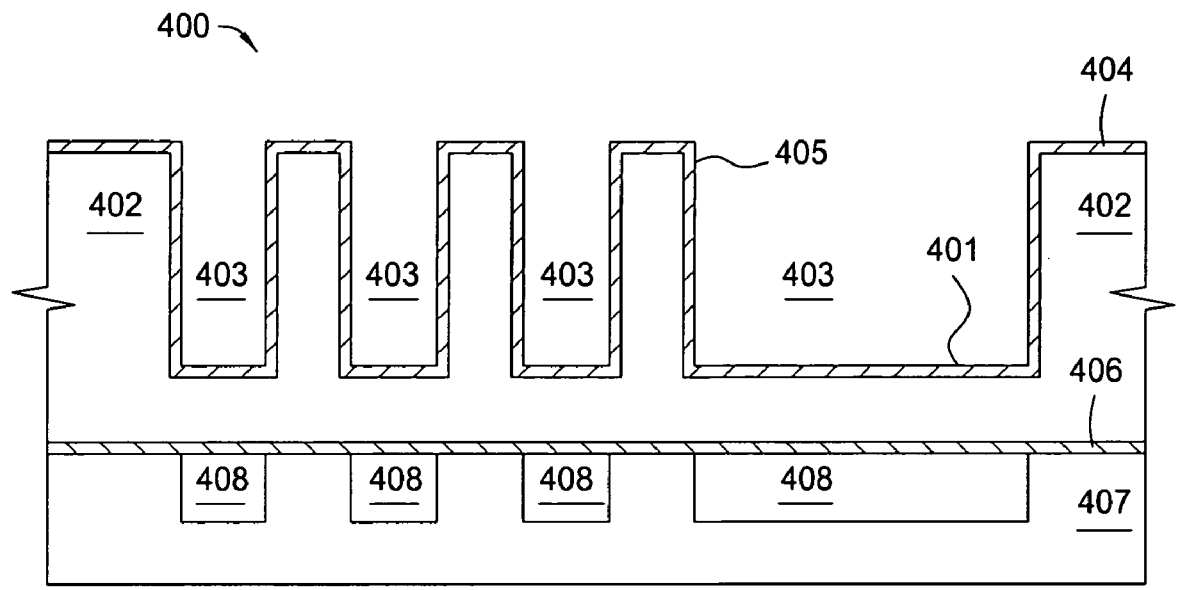
FIGS. 4A-4D illustrate schematic cross-sectional views of integrated circuits formed by other deposition processes described within embodiments herein.

FIG. 4A illustrates a cross-sectional view of substrate 400 containing conductive contacts 408 formed within dielectric layer 407 and capped by barrier layer 406. Substrate 400 further contains barrier layer 404 disposed over dielectric layer 402 containing features, such as vias, trenches, or apertures 403, formed therein. Barrier layer 404 and covers sidewalls 405 and bottom surfaces 401 of apertures 403.

Figure 4B:
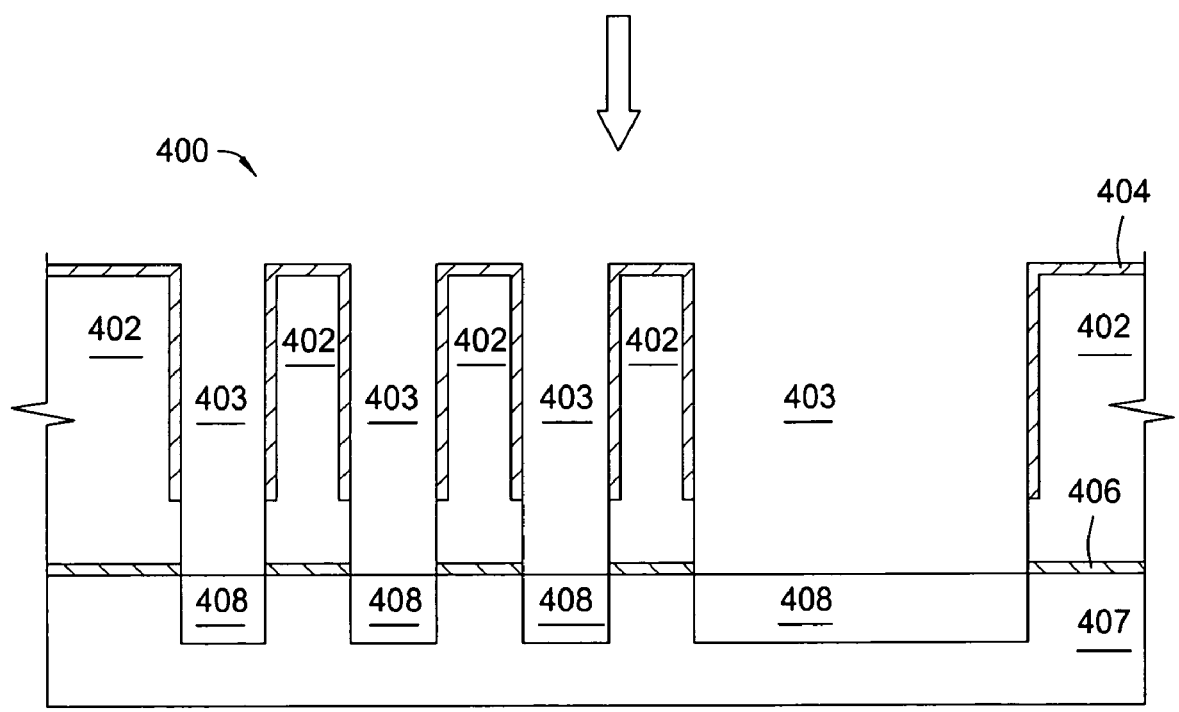

FIG. 4B depicts substrate 400 after being exposed to a plasma etch process to increase the depth of apertures 403 and reveal contacts 408. Plasma etch processes may include a re-sputter process conducted in a PVD chamber as described herein or in any process chamber equipped with a RPS or RPC unit. A plasma etch process removes a portion of material from barrier layer 404 at bottom surface 401 of apertures 403, as well portions of material from dielectric layer 402 and barrier layer 406 that are aligned between apertures 403 and contacts 408. Plasma etch processes useful to expose conductive contacts 408 are further described during the process to expose conductive contacts 208 depicted in FIG. 2C.

Dielectric layers 302, 307, 402, and 407 may contain silicon or silicon-containing materials such as silicon germanium, silicon dioxide, silicon nitride, SOI, doped silicon, FSG, silicon oxynitride, or carbon doped silicon oxides, such as $SiO_xC_y$, for example, BLACK DIAMOND® low-k dielectric, available from Applied Materials, Inc., located in Santa Clara, Calif. Apertures 303 may be formed through dielectric layer 302 to expose contacts 308, as well as, apertures 403 may be formed through dielectric layer 402 and barrier layer 406 to expose contacts 408 by techniques well known in the art, such as a mask and etch process.

Barrier layers 304 and 404 may contain a single layer of one material or multiple layers of varying materials. Barrier layers 304, 306, 404, and 406 may contain tantalum, tantalum nitride, tantalum silicon nitride, titanium, titanium nitride, titanium silicon nitride, ruthenium, tungsten, tungsten nitride, silicon nitride, alloys thereof, derivatives thereof, or combinations thereof. In one example, barrier layers 304 and 404 contain tantalum and/or tantalum nitride. Conductive contacts 308 and 408 contain copper, tungsten, aluminum, alloys thereof, or derivatives thereof. Although not shown, conductive contacts 308 and 408 are usually encompassed by at least one barrier material to prevent diffusion of conductive material into neighboring dielectric layers 307 and 407.

Figure 3C:
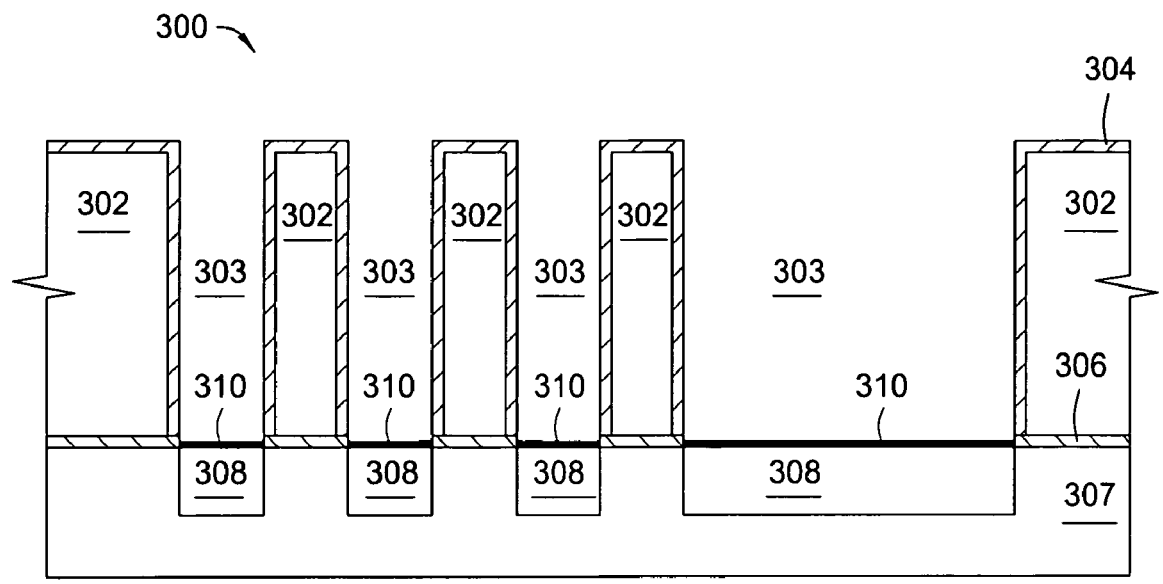
Figure 4C:
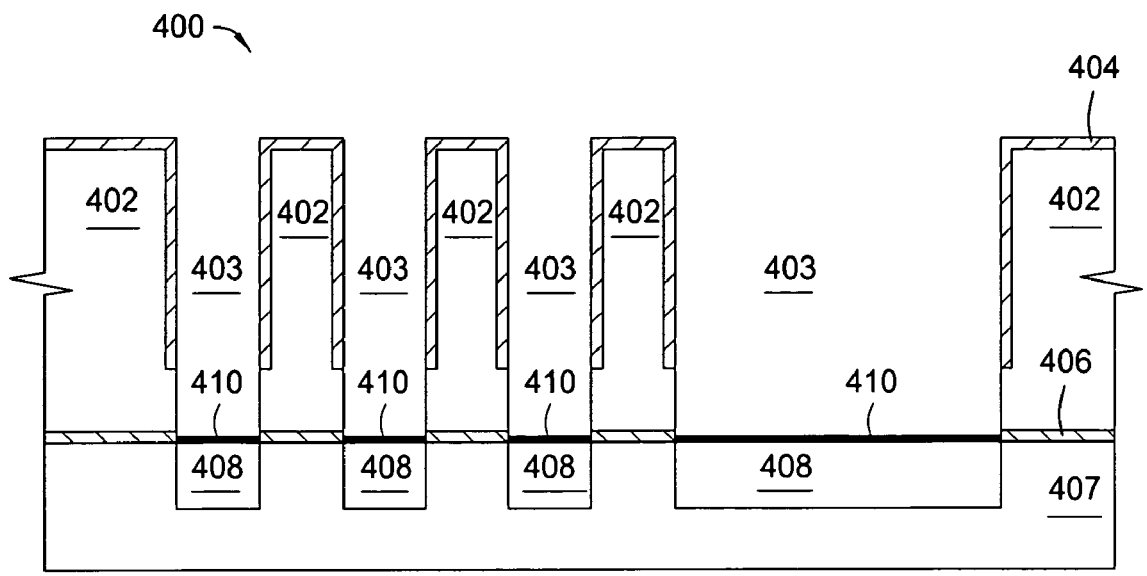

FIGS. 3C and 4C illustrate cross-sectional views of substrates 300 and 400 after the formation of ruthenium seed layers 310 and 410 on conductive contacts 308 and 408. Ruthenium seed layers 310 and 410 are formed by depositing ruthenium oxide onto conductive contacts 308 and 408 and subsequently and/or concurrently chemically reducing the ruthenium oxide to form a ruthenium-containing material. Ruthenium-containing material may include metallic ruthenium or a ruthenium alloy. Ruthenium seed layers 310 and 410 are deposited having a thickness within a range from about 1 Å to about 30 Å, preferably, from about 2 Å to about 20 Å, and more preferably, from about 3 Å to about 10 Å, such as about 5 Å.

Ruthenium seed layers 310 and 410 have several characteristic properties that are useful during the process of forming conductive materials described herein. Ruthenium seed layers 310 and 410 are excellent catalytic surfaces to initiate the subsequently deposited copper-containing layers 320 and 420. Also, ruthenium-containing materials are excellent electrical conductors and therefore minimally increase the resistance throughout a conductive material, such as a contact. Further, ruthenium seed layers 310 and 410 form strong adhesion to the underlying conductive contacts 308 and 408. It is believed that this strong adhesion is in part due to the transformations that occur at the interface between seed layers 310 and 410 and conductive contacts 308 and 408. For example, when conductive contacts 308 and 408 contain copper, the interface transforms from ruthenium oxide on copper, to ruthenium on copper oxide to ruthenium on copper during the complete reduction process. Therefore, ruthenium and copper atoms are covalently bonded at the interface to produce the utmost adhesion between two surfaces.

Ruthenium seed layers 310 and 410 are formed by a vapor deposition process that includes an ALD process, a CVD process, a PVD process, or combinations thereof. In one example, ruthenium seed layers 310 and 410 are deposited by sequentially pulsing a ruthenium precursor (e.g., ruthenium tetroxide) and a reductant (e.g., hydrogen) during an ALD process. Thereafter, substrates 300 and 400 may be thermally processed in a reducing atmosphere, such as in an annealing chamber containing an environment of hydrogen, to further reduce any remaining ruthenium oxide to a ruthenium-containing material.

Ruthenium tetroxide may be delivered to the substrate in a vapor deposition process, such as an in situ generated process. Preferably, ruthenium tetroxide is generated in situ by exposing a ruthenium-containing source to an oxidizing gas prior and exposing the resulting product to conductive contacts 308 and 408. Ruthenium tetroxide is a strong oxidant and therefore readily reacts with any exposed copper, copper oxides, tungsten, or tungsten oxides on the surfaces of conductive contacts 308 and 408.

In one example of forming ruthenium tetroxide, ozone gas is produced by supplying an oxygen source gas into an ozone generator. The oxygen source may include oxygen ($O_2$), nitrous oxide ($N_2O$), nitric oxide (NO), nitrogen dioxide ($NO_2$), or combinations thereof. Preferably, a 12 vol % ozone is generated by flowing oxygen through the ozone generator. The oxidizing gas containing ozone may be purified when passed or bubbled through a silicon gel. Subsequently, the ozone is exposed to a metallic ruthenium source to form ruthenium tetroxide that is condensed in a cooled cold trap. The ozone flow is stopped and the cold trap is purged with an inert gas (e.g., nitrogen) to rid the line of excess oxygen. Thereafter, the cold trap is warmed to a temperature to sublime the ruthenium tetroxide while a flow of inert gas is passed therethrough. The vaporized ruthenium tetroxide forms a deposition gas by saturating an inert gas selected from argon, nitrogen, or helium.

In one exemplary vapor deposition process, a deposition gas containing ruthenium tetroxide is sequentially pulsed with a reductant into an ALD chamber to form a ruthenium metal layer or a ruthenium oxide layer on the underlying copper contacts. In one aspect, the ALD process contains a consistent flow of carrier gas while the ruthenium tetroxide and the reductant are sequentially pulsed into the carrier gas. In another aspect, the ALD process cycle contains a pulse of purge gas, a pulse of ruthenium tetroxide, a pulse of purge gas, and a pulse of the reductant. The carrier gas and the purge gas may be independently selected from hydrogen, argon, nitrogen, or helium. Reductants that are useful during vapor deposition process for forming ruthenium-containing materials include hydrogen, diborane, silane, disilane, phosphine, plasmas thereof, derivatives thereof, or combinations thereof. A more thorough disclosure of ALD processes to deposit ruthenium-containing materials is described in commonly assigned U.S. Ser. No. 10/811,230, entitled, "Ruthenium Layer Formation for Copper Film Deposition," filed Mar. 26, 2004, and published as US 2004-0241321, which is herein incorporated by reference.

After an ALD process, the substrate may be exposed to a thermal process by heating to a temperature within a range from about 100° C. to about 800° C., preferably, from about 200° C. to about 600° C., and more preferably, from about 300° C. to about 500° C. The thermal process may be conducted in an environment containing hydrogen gas. During the thermal process, the oxygen concentration within the substrate, especially within the conductive contact and ruthenium-containing material thereon, is decreased. Any remaining ruthenium oxides and copper oxides are chemically reduced to form their respective metal.

In another exemplary vapor deposition process, a deposition gas containing ruthenium tetroxide is delivered to substrates 300 or 400. Substrates 300 or 400 are maintained at a temperature of about 100° C. during the process. After exposing substrates 300 or 400 to the ruthenium tetroxide containing gas for about 30 seconds, a ruthenium oxide layer is formed on conductive contacts 308 and 408. The ruthenium oxide layer may be exposed to a reductant to form a ruthenium-containing layer. The ruthenium oxide may be chemically reduced to ruthenium. For example, a ruthenium oxide layer may be exposed to a hydrogen plasma to remove the oxygen and form a metallic ruthenium-containing layer. In another example, a ruthenium oxide layer is exposed to diborane during a vapor deposition process to remove oxygen and form a ruthenium-containing layer containing ruthenium boride. In another example, a ruthenium oxide layer is exposed to phosphine during a vapor deposition process to remove oxygen and form ruthenium-containing layer containing ruthenium phosphide.

Figure 3D:
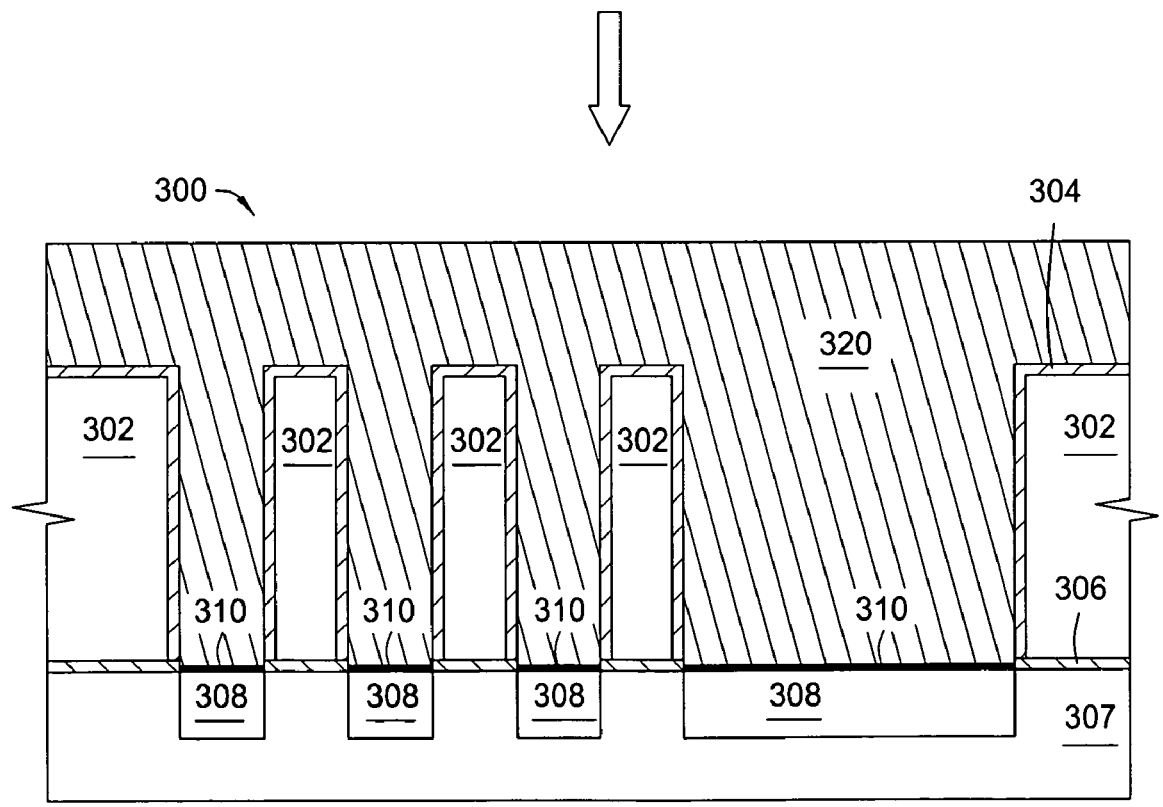
Figure 4D:
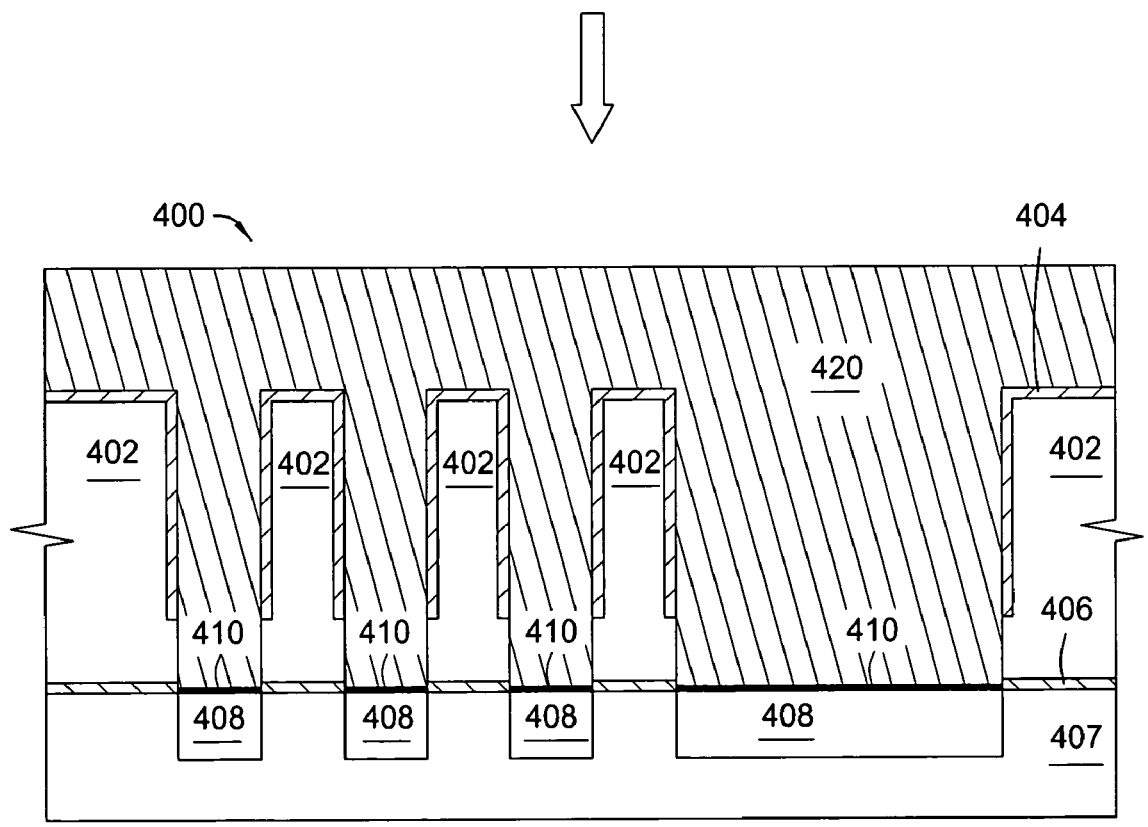

FIGS. 3D and 4D illustrate copper-containing layers 320 and 420 deposited on ruthenium seed layers 310 and 410 deposited during an electroless deposition process. Apertures 303 and 403 are bottom up filled with copper-containing material while avoiding defects (e.g., seams, voids or gaps) within copper-containing layers 320 and 420. The electroless deposition process utilizes an electroless solution containing a copper source and at least one additive, such as an accelerator, a suppressor, or a leveler. Copper-containing layers 320 and 420 contain copper or a copper alloy and are deposited according to electroless deposition processes and solutions previously discussed to form copper-containing layer 120. In one embodiment, copper-containing layers 320 and 420 have a convexed copper surface or a concaved copper surface, as described similarly for copper-containing layer 120 having convexed surface 126 (FIG. 1C) or concaved surface 128 (FIG. 1D). The convexed/concaved copper surfaces may adjoin sidewalls 305 or 405 at an angle of less than 90° from sidewall 305 or 405, such as within a range from about 5° to about 60°, preferably, from about 5° to about 45°, and more preferably, from about 5° to about 30°.

Copper Electroless Deposition Process

In one embodiment, an electroless copper solution may be prepared combining three solutions (e.g., Solutions A, B, and C) and water.

Solution A may contain about 525 mL of TMAH (25%), about 475 mL of deionized water, and about 1 g/L of surfactant (e.g., PEG, PEG-PPG-PEG, TRITON® 100, TERGITOL®, or RHODAFAC® RE-610).

Solution B may contain about 62.5 g/L of copper sulfate, about 146 g/L of EDTA, and enough TMAH to provide Solution B with a pH value of about 12.5 at about 20° C.

In one example, Solution C may contain about 200 g/L of glyoxylic acid and enough TMAH to provide Solution C with a pH value of about 9 at about 20° C. The copper deposition rate is increased by increasing the concentration of the glyoxylic acid. In another example, Solution C may contain about 138 g/L of glyoxylic acid, about 13.5 g/L of hypophosphorous acid, and enough TMAH to provide Solution C with a pH value of about 9 at about 20° C.

In one example, a mixture is formed by adding about 10 mL of Solution A to about 70 mL of heated deionized water (about 75° C). Subsequently, about 10 mL of Solution C is added to the mixture, then, about 10 mL of Solution B is added to the mixture to form about 100 mL of the copper electroless deposition solution.

In another embodiment, at least one leveler may be added to the copper electroless deposition solution to provide better deposition control during copper surface plating processes. Leveler may be added to any of the solutions, but preferably to either Solution A or Solution C. The electroless deposition solution may contain a leveler at concentration within a range from about 20 parts per billion (ppb) to about 600 parts per million (ppm), preferably, from about 100 ppb to about 100 ppm. Examples of levelers that may be employed in an electroless solution include, but are not limited to, alkylpolyimines and organic sulfonates, such as 1-(2-hydroxyethyl)-2-imidazolidinethione (HIT), 4-mercaptopyridine, 2-mercaptothiazoline, ethylene thiourea, thiourea, or derivatives thereof.

In one example of a solution containing a leveler, Solution A may contain about 525 mL of TMAH (25%), about 475 mL of deionized water, about 10 ppm of HIT, and about 1 g/L of surfactant. In another example, Solution C may contain about 200 g/L of glyoxylic acid, about 10 ppm of HIT, and enough TMAH to provide Solution C with a pH value of about 9. In another example, Solution C may contain about 138 g/L of glyoxylic acid, about 13.5 g/L of hypophosphorous acid, about 10 ppm of HIT, and enough TMAH to provide Solution C with a pH value of about 9.

While the foregoing is directed to embodiments of the invention, other and further embodiments of the invention may be devised without departing from the basic scope thereof, and the scope thereof is determined by the claims that follow.

The invention claimed is:

1. A method for forming a conductive material within a feature on a substrate comprising:
    depositing a seed layer selectively onto a bottom surface of a feature on a substrate while sidewalls of the feature remain substantially free of the seed layer during a collimated physical vapor deposition process; and
    depositing a copper-containing layer on the seed layer to fill the feature during an electroless deposition process, wherein the seed layer comprises a metal selected from the group consisting of copper, ruthenium, cobalt, tantalum, titanium, tungsten, rhenium, palladium, platinum, nickel, alloys thereof, and combinations thereof and wherein the seed layer is deposited on a barrier layer disposed on the substrate, the barrier layer comprises a material selected from the group consisting of tantalum, tantalum nitride, tantalum silicon nitride, titanium, titanium nitride, titanium silicon nitride, ruthenium, tungsten, tungsten nitride, alloys thereof, derivatives thereof, and combinations thereof.

2. The method of claim 1, wherein the bottom surface of the feature is exposed to a plasma to remove a portion of the seed layer and the barrier layer and to expose a conductive underlayer prior to filling the feature by the electroless deposition process.

3. A method for forming a conductive material within a feature on a substrate, comprising:
    depositing a seed layer selectively onto a bottom surface of a feature on a substrate while sidewalls of the feature remain substantially free of the seed layer during a collimated physical vapor deposition process; and
    depositing a copper-containing layer on the seed layer to fill the feature during an electroless deposition process, wherein the electroless deposition process comprises exposing the substrate to an electroless solution comprising a copper source and at least one additive selected from the group consisting of an accelerator, a suppressor, a leveler, and combinations thereof, wherein the accelerator is a sulfur-based compound selected from the group consisting of bis(3-sulfopropyl) disulfide, 3-mercapto-1-propane sulfonic acid, derivatives thereof, and combinations thereof.

4. A method for forming a conductive material within a feature on a substrate, comprising:
    depositing a seed layer selectively onto a bottom surface of a feature on a substrate while sidewalls of the feature remain substantially free of the seed layer during a collimated physical vapor deposition process; and
    depositing a copper-containing layer on the seed layer to fill the feature during an electroless deposition process, wherein the electroless deposition process comprises exposing the substrate to an electroless solution comprising a copper source and at least one additive selected from the group consisting of an accelerator, a suppressor, a leveler, and combinations thereof, wherein the suppressor is polyethylene glycol, polypropylene glycol, polyoxyethylene-polyoxypropylene copolymer, or derivatives thereof.

5. A method for forming a conductive material within a feature on a substrate, comprising:
depositing a seed layer selectively onto a bottom surface of a feature on a substrate while sidewalls of the feature remain substantially free of the seed layer during a collimated physical vapor deposition process; and
depositing a copper-containing layer on the seed layer to fill the feature during an electroless deposition process, wherein the electroless deposition process comprises exposing the substrate to an electroless solution comprising a copper source and at least one additive selected from the group consisting of an accelerator, a suppressor, a leveler, and combinations thereof, wherein a surface of the copper-containing layer adjoins the sidewall of the feature at an angle of less than 90° from the sidewall.

6. The method of claim 5, wherein the angle is within a range from about 5° to about 45°.

7. The method of claim 5, wherein a concentration of the leveler is adjusted to control the angle.

8. The method of claim 7, wherein the leveler is an alkylpolyimine compound or an organic sulfonate compound.

9. The method of claim 8, wherein the leveler is selected from the group consisting of 1-(2-hydroxyethyl)-2-imidazolidinethione, 4-mercaptopyridine, 2-mercaptothiazoline, ethylene thiourea, thiourea, derivatives thereof, and combinations thereof.

10. The method of claim 7, wherein the concentration of the leveler is within a range from about 20 ppb to about 600 ppm.

11. The method of claim 10, wherein the leveler is 1-(2-hydroxyethyl)-2-imidazolidinethione.

12. A method for forming a conductive material within a feature on a substrate, comprising:
depositing a seed layer onto a barrier layer disposed on a substrate during a physical vapor deposition process, wherein the substrate contains a feature having sidewalls and a bottom surface;
etching the bottom surface of the feature with a plasma to remove a portion of the seed layer and the barrier layer and to expose a conductive underlayer; and
depositing a copper-containing layer on the conductive underlayer while filling the feature during an electroless deposition process.

13. The method of claim 12, wherein the seed layer comprises a metal selected from the group consisting of copper, ruthenium, cobalt, tantalum, titanium, tungsten, rhenium, palladium, platinum, nickel, alloys thereof, and combinations thereof.

14. The method of claim 13, wherein the seed layer is selectively deposited on the bottom surface of the feature while the sidewalls of the feature remain substantially free of the seed layer during a collimated physical vapor deposition process.

15. The method of claim 13, wherein the barrier layer comprises a material selected from the group consisting of tantalum, tantalum nitride, tantalum silicon nitride, titanium, titanium nitride, titanium silicon nitride, ruthenium, tungsten, tungsten nitride, alloys thereof, derivatives thereof, and combinations thereof.

16. The method of claim 13, wherein the conductive underlayer contains a metal selected from the group consisting of copper, tungsten, aluminum, alloys thereof, and combinations thereof.

17. The method of claim 16, wherein the plasma is formed by a remote plasma source.

18. The method of claim 12, wherein the electroless deposition process comprises exposing the substrate to an electroless solution comprising a copper source and at least one additive selected from the group consisting of an accelerator, a suppressor, a leveler, and combinations thereof.

19. The method of claim 18, wherein the accelerator is a sulfur-based compound selected from the group consisting of bis(3-sulfopropyl) disulfide, 3-mercapto-1-propane sulfonic acid, derivatives thereof, and combinations thereof.

20. The method of claim 18, wherein the suppressor is polyethylene glycol, polypropylene glycol, polyoxyethylene-polyoxypropylene copolymer, or derivatives thereof.

21. The method of claim 18, wherein a surface of the copper-containing layer adjoins the sidewall of the feature at an angle of less than 90° from the sidewall.

22. The method of claim 21, wherein the angle is within a range from about 5° to about 45°.

23. The method of claim 21, wherein a concentration of the leveler is adjusted to control the angle.

24. The method of claim 23, wherein the leveler is an alkylpolyimine compound or an organic sulfonate compound.

25. The method of claim 24, wherein the leveler is selected from the group consisting of 1-(2-hydroxyethyl)-2-imidazolid inethione, 4-mercaptopyridine, 2-mercaptothiazoline, ethylene thiourea, thiourea, derivatives thereof, and combinations thereof.

26. The method of claim 23, wherein the concentration of the leveler is within a range from about 20 ppb to about 600 ppm.

27. The method of claim 26, wherein the leveler is 1-(2-hydroxyethyl)-2-imidazolidinethione.

28. A method for forming a conductive material within a feature on a substrate, comprising:
depositing a seed layer onto a barrier layer disposed on a substrate during a physical vapor deposition process, wherein the substrate contains a feature having sidewalls and a bottom surface; and
exposing the substrate to an electroless deposition solution to deposit a copper-containing layer over the seed layer, wherein the electroless deposition solution comprises a leveler at a concentration to form a surface of the copper-containing layer adjoining the sidewall of the feature at an angle of less than 90° from the sidewall.

29. The method of claim 28, wherein the angle is within a range from about 5° to about 45°.

30. The method of claim 28, wherein the concentration of the leveler is adjusted to control the angle.

31. The method of claim 30, wherein the leveler is an alkylpolyimine compound or an organic sulfonate compound.

32. The method of claim 31, wherein the leveler is selected from the group consisting of 1-(2-hyd roxyethyl)-2-imidazolid inethione, 4 -mercaptopyridine, 2 -mercaptothiazoline, ethylene thiourea, thiourea, derivatives thereof, and combinations thereof.

33. The method of claim 30, wherein the concentration of the leveler is within a range from about 20 ppb to about 600 ppm.

34. The method of claim 33, wherein the leveler is 1-(2-hydroxyethyl)-2-imidazolidinethione.

35. The method of claim 29, wherein the electroless solution further comprises a copper source and at least one additive selected from the group consisting of an accelerator, a suppressor, and combinations thereof.

36. The method of claim 35, wherein the accelerator is a sulfur-based compound selected from the group consisting of bis(3-sulfopropyl) disulfide, 3-mercapto-1- propane sulfonic acid, derivatives thereof, and combinations thereof.

37. The method of claim 35, wherein the suppressor is polyethylene glycol, polypropylene glycol, polyoxyethylene-polyoxypropylene copolymer or derivatives thereof.

38. The method of claim 29, wherein the seed layer comprises a metal selected from the group consisting of copper, ruthenium, cobalt, tantalum, titanium, tungsten, rhenium, palladium, platinum, nickel, alloys thereof, and combinations thereof.

39. The method of claim 38, wherein the seed layer is selectively deposited on the bottom surface of the feature while the sidewalls of the feature remain substantially free of the seed layer during a collimated physical vapor deposition process.

40. The method of claim 38, wherein the barrier layer comprises a material selected from the group consisting of tantalum, tantalum nitride, tantalum silicon nitride, titanium, titanium nitride, titanium silicon nitride, ruthenium, tungsten, tungsten nitride, alloys thereof, derivatives thereof, and combinations thereof.

41. The method of claim 40, wherein the bottom surface of the feature is exposed to a plasma to remove a portion of the seed layer and the barrier layer and to expose a conductive underlayer prior to filling the feature by the electroless deposition process.

* * * * *

UNITED STATES PATENT AND TRADEMARK OFFICE
CERTIFICATE OF CORRECTION

PATENT NO. : 7,651,934 B2  Page 1 of 1
APPLICATION NO. : 11/385037
DATED : January 26, 2010
INVENTOR(S) : Lubomirsky et al.

It is certified that error appears in the above-identified patent and that said Letters Patent is hereby corrected as shown below:

In the Claims:

Column 18, Claim 25, Lines 26-27, please delete "1-(2-hydroxyethyl)-2-imidazolid inethione" and insert --1-(2-hydroxyethyl)-2-imidazolidinethione-- therefor;

Column 18, Claim 32, Lines 55-56, please delete "1-(2-hyd roxyethyl)-2-imidazolid inethione" and insert --1-(2-hydroxyethyl)-2-imidazolidinethione-- therefor.

Signed and Sealed this

Sixth Day of April, 2010

David J. Kappos
*Director of the United States Patent and Trademark Office*